United States Patent [19]
Nakai et al.

[11] Patent Number: 5,553,026
[45] Date of Patent: Sep. 3, 1996

[54] NON-VOLATILE SEMICONDUCTOR MEMORY DEVICE

[75] Inventors: Hiroto Nakai, Yokohama; Tadashi Miyakawa, Adachi-Ku; Shigeru Matsuda, Ichikawa, all of Japan

[73] Assignee: Kabushiki Kaisha Toshiba, Tokyo, Japan

[21] Appl. No.: 364,348

[22] Filed: Dec. 27, 1994

[30] Foreign Application Priority Data

Dec. 28, 1993 [JP] Japan .................. 5-351340

[51] Int. Cl.$^6$ ........................... G11C 7/00
[52] U.S. Cl. ............ 365/201; 365/185.29; 365/218; 365/230.03; 365/230.08
[58] Field of Search ..................... 365/201, 218, 365/230.03, 230.08, 185.11, 185.29

[56] References Cited

U.S. PATENT DOCUMENTS

| | | | |
|---|---|---|---|
| 5,053,990 | 10/1991 | Kreifels et al. ............ | 364/900 |
| 5,274,596 | 12/1993 | Watanabe ................. | 365/230.03 X |
| 5,301,162 | 4/1994 | Shimizu .................. | 365/230.03 |
| 5,367,495 | 11/1994 | Ishikawa ................. | 365/239 |
| 5,418,742 | 5/1995 | Asano .................... | 365/218 X |

FOREIGN PATENT DOCUMENTS 3230397  10/1991  Japan .

OTHER PUBLICATIONS

International Search Report dated May 18, 1995, appl. No. 94120818.3.

Primary Examiner—David C. Nelms
Assistant Examiner—Son Dinh
Attorney, Agent, or Firm—Loeb & Loeb LLP

[57] ABSTRACT

The non-volatile memory device comprises a memory cell array, a block decoder, and a decode signal reading section. The memory cell array has a plurality of cell blocks. Each of the cell blocks is composed of a plurality of memory cells arranged roughly into a matrix pattern. Each memory cell has a floating gate to or from which electrons are injected or extracted to write or erase data. The block decoder receives a block address, and outputs a decode signal to select a cell block corresponding to the block address from the cell blocks. The memory cells of the selected block are erased simultaneously. When a control signal is inputted to the block decoder, the block decoder outputs the decode signal to select all the cell blocks for erasure of the memory cells of all the cell blocks simultaneously, irrespective of the block address. The decode signal reading section outputs the decode signal to the outside. The decode signal is applied to the cell blocks and in parallel to the decode signal reading section itself and further outputted to the outside therethrough. In the memory device, the block erase function can be checked at a short time and additionally the other functional blocks can be checked simply.

10 Claims, 28 Drawing Sheets

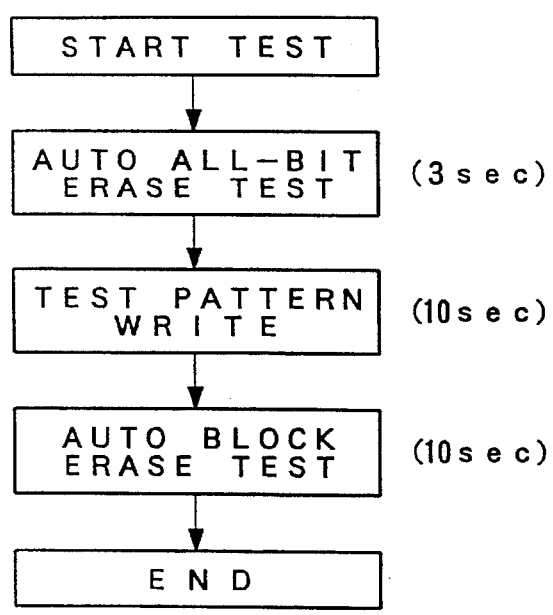 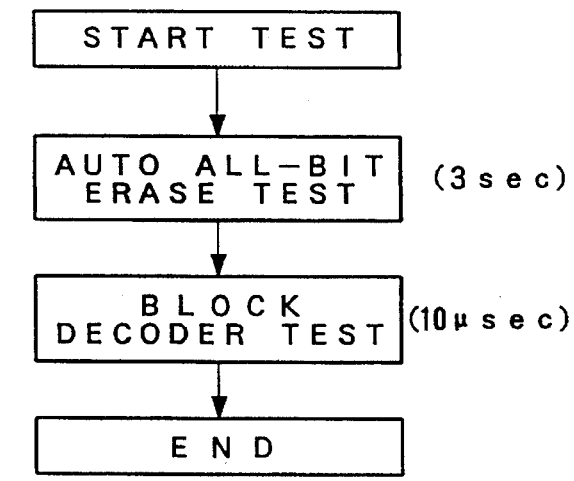
FIG. 6 (a)
PRIOR ART
FIG. 6 (b)
EMBODIMENT 1

| MODE | SELECT/NON-SELECT | NODE G | NODE H | NODE I | SOURCE LINE POT |
|---|---|---|---|---|---|
| ERASE C="H" | SELECT | 1 | 0 | 0 | 12V |
| | NON-SELECT | 0 | 1 | 0 | 0V |
| WRITE P="H" | SELECT | 0 | 1 | 0 | 0V |
| | NON-SELECT | 0 | 0 | 1 | 2V |
| READ | SELECT | 0 | 1 | 0 | 0V |
| | NON-SELECT | 0 | 1 | 0 | 0V |
| BLOCK TEST T="H" | SELECT | 1 | 0 | 0 | 3V |
| | NON-SELECT | 0 | 1 | 1 | 2V or 0V |

0 = "L" LEVEL
0 = "H" LEVEL

FIG. 9

NON-VOLATILE SEMICONDUCTOR MEMORY DEVICE

FIELD OF THE INVENTION

The present invention relates to a non-volatile semiconductor memory device, and more specifically to a non-volatile semiconductor memory device of flash type (for electrically erasing data collectively), which is suitable to test its own block erasure function in a short time.

BACKGROUND OF THE INVENTION

The non-volatile memory which can write and erase data electrically has been well known as flash type EEPROM. In the flash type EEPROM, memory cells of double layer structure having a floating gate are used. That is, when data are required to be written, hot electrons are injected into the floating gates; and when data are required to be erased, a high supply voltage is applied to the sources of the MOS transistors for constituting the memory cells, respectively.

The structure and principle of the memory cells of the flash type EEPROM as described above are disclosed in Intel Flash Memory/28F256A, 28F512, 28F010, 28F20, Intel Corp. Engineering Report ER24, October 1991, for instance.

In general, the above-mentioned flash type EEPROM is provided with such a function as to erase data in all the chip and data in unit of block, respectively. In addition, the flash type EEPROM usually has a verify function for confirming whether the data in the memory cells have been completely erased or not after erasure operation.

FIG. 20 is a block diagram showing a memory construction of a conventional non-volatile semiconductor memory device, in which the structure provided with erase and verify functions in unit of block are shown in particular.

As shown, a cell array 1 is constructed being divided into several array blocks 1 to 8. To the cell array 1, word select lines WL1 to WLn are connected. These word select lines WL1 to WLn are derived from a row decoder circuit 6. On the basis of decoding operation of the row decoder circuit 6, only one of the word select lines WL1 to WLn is activated to select one word line of the memory cell array 1. On the other hand, bit lines are derived from a column gate transistors group 7, and 4-bit lines are selected on the basis of a decode signal outputted by a column decoder circuit 15.

Through the bit lines selectively derived via the column gate transistor group 7, data are written in and read from the cell array 1. That is, data are written in the cell array 1 through a write load circuit 16 and read from the cell array 1 through a sense amplifier 8 composed of 4 sense amplifier blocks S/A1 to S/A4.

An input/output circuit 9 inputs commands and data, and further outputs data. The commands and data are inputted or outputted as 4 bit data. When data inputs Din1 to Din4 inputted to the input/output circuit 9 are data, these data are written in the memory cell array 1 through the data write load circuit 16. When data inputs Din1 to Din4 inputted to the input/output circuit 9 are commands, these command data are given to a command input circuit 12. The cell array (1) data read through the sense amplifier 8 are outputted to the outside through the input/output circuit as 4 bit read data D*1 to D*4. Further, the read data D*1 to D*4 are given to a verify circuit 11 to verify erasure results in unit of chip or block.

The addresses A0 to An for selecting memory cells in the cell array 1 are inputted through an address buffer circuit 5. When an internal signal C is at an "L" level, the address buffer circuit 5 outputs the addresses A0 to An, as they are, as A*0 to A*n; and when the internal signal C is at an "H" level, the address buffer circuit 5 outputs an output of a counter circuit 10 as the address A*0 to A*n. The addresses A*0 to A*n include both column addresses A*0 to A*3 and row addresses A*6 to A*n, respectively, The addresses A*0 to A*2 in the column addresses A*0 to A*3 are applied to both the column decoder circuit 15 and a block decoder 3 through an address latch circuit 4 as addresses AL*0 to A*L2. The address A*3 of the column addresses A*0 to A*3 is directly applied to the column decoder circuit 15.

Here, when an internal signal A is at the "L" level, the address latch circuit 4 outputs the column addresses A*0 to A*2, as they are, as the addresses AL*0 to AL*2. However, when the internal signal A changes to the "H" level, the address latch circuit 4 latches the column addresses A*0 to A*2 at a time point when the internal signal A changes to the "H" level, and outputs the latched addresses, as the addresses AL*0 to AL*2.

When an internal signal B is at the "L" level, the block decoder 3 decodes the addresses AL*0 to AL*2 and outputs any one of the block select signals EA1 to EA8 as the "H" level signal. When the internal signal B is at the "H" level, the block outputs all the block select signals EA1 to EA8 as the "H" level signals. These block select signals EA1 to EA8 are given to cell source voltage supply blocks CSC1 to CSC8 of a cell source voltage supply circuit 2 to erase data in the cell array 1 in unit of chip or block.

On the other hand, the row addresses A*6 to A*n of the addresses A*0 to A*n given by the address buffer circuit 5 are decoded by the row decoder 6 and then given to the cell array 1 thorough the word select lines WL1 to WLn. Here, when the internal signal C is at the "L" level, the row decoder circuit 6 decodes the given addresses; and when the internal signal C is at the "H" level, the row decoder circuit 6 deactivates all the word select lines WL1 to WLn.

Further, the column address A*3 and the addresses AL*0 to AL*2 of the address latch circuit (of the addresses A*0 to A*n) are all inputted to the column decoder circuit 15, and the decoded signals are given to the column gate transistor group 7. Further, the decoded signals are used to derive bit lines from the column gate transistor group 7, for column selection of the respective cell array blocks 1 to 8 of the cell array 1. Here, when the internal signal C is at the "L" level, the column decoder circuit 15 decodes the addresses. When the internal signal C is at the "H" level, however, the column decoder circuit 15 does not derive the bit lines from the column gate transistor group 7.

Now, to the respective cell array blocks 1 to 8, the cell source voltage supply blocks CSC1 to CSC8 for supplying an erase voltage to the sources of the MOS transistors for constituting the cell array 1 in unit of block are connected for data erasure. These cell source voltage supply blocks CSC1 to CSC8 constitute a cell source voltage supply circuit 2. On the basis of block select signals EA1 to EA8 applied from the block decoder 3, the cell source voltage supply circuit 2 controls the erasure operation in unit of chip or block by selecting none, one or all of the cell source voltage supply blocks CSC1 to CSC8.

A read/write control circuit 14 controls data write and data read in and from the cell array 1 through the input output circuit 9, and further data erasure from the cell array 1 through an automatic erase control circuit 13. To the read/write control circuit 14, a CE signal, an OE signal and an external voltage Vpp are inputted.

When data in the cell array 1 are erased, the read/write control circuit 14 outputs a control signal CME to the command input circuit according to the commands (i.e., data input Din1 to Din4) inputted through the input/output circuit 9. In response to the control signal CME, the command input circuit 12 outputs the internal signal A or B. On the basis of the internal signal A or B of the command input circuit 12 and the signal applied by the read/write control circuit 14, the automatic erase control circuit 13 outputs the internal signal C or D and further controls the counter circuit 10.

When all the data D*1 to D*4 outputted by the sense amplifier 8 for reading data from the cell array 1 are at the "H" level, the verify circuit 11 checks the erasure statuses (levels) of the cell array (1) data read by the sense amplifier 8, and gives the checked result to the counter circuit 10 as a verify signal VRF. Further, the operation of the verify circuit 11 is controlled on the basis of the internal signal D applied by the automatic erase control circuit 13.

In the erasure operation, the automatic erase control circuit 13 controls the counter circuit 10 to generate erase addresses, disables the addresses A0 to An inputted to the address buffer circuit 5, and gives the internal signal C to the row decoder circuit 6 and the column decoder circuit 15 to deactivate the output lines thereof. In accompany with the erasure operation, at the same time, the automatic erase control circuit 13 gives the internal signal C to the cell source voltage supply circuit 2 to active the circuit 2 and the internal signal D to the verify circuit 11 to disable the verify signal VRF outputted by the verify circuit 11.

FIG. 21 is a block diagram showing only the cell array 1, the sense amplifier 8 and the write load circuit 16 all extracted from the conventional memory device shown in FIG. 20. As shown in FIG. 21, the cell array blocks 1 to 8 for constituting the cell array 1 are each composed of MOS transistors arranged into a matrix pattern. The word select lines WL1 to WLn are connected to the gates of the respective MOS transistors in unit of word. Further, the source lines of the respective MOS transistors are connected in common to one CSC1 of the cell source voltage supply blocks CSC1 to CSC8 of the cell source voltage supply circuit 2 shown in FIG. 20, respectively in unit of cell block.

Further, the drains of the transistors for constituting the cell block are derived as bit lines and connected to the sense amplifier 8 and the write load circuit 16 via two MOS transistors 20 and 19 for constituting the column gate transistor group 7 shown in FIG. 20.

Further, to the gates of the transistors 19 for constituting the column gate transistor group 7, signals g1 to g8 are given from the column decoder circuit 15 shown in FIG. 20, respectively. On the other hand, to the gates of the transistors 20 for constituting the column gate transistor group 7, signals h1 and h2 are given from the column decoder circuit 15 shown in FIG. 20, respectively.

In the circuit construction as described above, one of the rows of the cell array 1 (one of the word select lines WL1 to WLn) is selected on the basis of a row address, and the four columns thereof are selected by the transistors 19 and 20 of the column gate transistor group 7.

In data write, the four bit lines selected on the basis of the cell selection are connected to the selected memory cells to write 4-bit data inputs Din1 to Din4 given from the write load circuit 16 in the selected memory cells. In data read, on the other hand, the selected memory cells are connected to the sense amplifier 8 to read internal data D*1 to D*4.

FIG. 22 is a circuit diagram showing the row decoder circuit 6 and the column decoder circuit 15 shown in FIG. 20, in which the row addresses A*6 to A*n are denoted by A*i (i=6 to n). Further, inversion signals of the row addresses A*i are denoted by inversion row addresses/A*i. All the combinations of the row addresses A*i and the inversion row addresses/A*i are inputted to NAND gates 17. On the other hand, an inversion signal of the internal signal C is applied to the NAND gates 17 via an inverter 31, respectively.

The outputs of the NAND gates 17 are connected to the word select lines WL1 to WLn via a MOS transistor 21 and an inverter circuit 22, respectively. The transistor 23 is used to pull up the gate of the inverter circuit 22 to the external voltage Vpp or the supply voltage Vcc. Further, the external voltage Vpp and the supply voltage Vcc are both applied also to the inverter 22, respectively.

On the other hand, the column addresses A*3 and AL*0 to AL*2 are denoted by the column addresses A*j (j=0 to 3). The inversion signals of the column addresses A*j are denoted by inversion column addresses/A*j. All the combinations of the column addresses A*j and the inversion column addresses/A*j are inputted to NAND gates 18. On the other hand, an inversion signal of the internal signal C is applied to the NAND gates 18 via the inverter 31, respectively.

The outputs of the NAND gates 18 are outputted as signals g1 to g8 (or h1 or h2) through a MOS transistor 25 and an inverter circuit 24, respectively. The transistor 26 is used to pull up the gate of the inverter circuit 24 to the external voltage Vpp or the supply voltage Vcc. Further, the external voltage Vpp and the supply voltage Vcc are both applied also to the inverter 24, respectively.

In data write, a high voltage of 12 V obtained by applying the external voltage Vpp to the inverter circuit 22 is applied to the selected one of the word select lines WL1 to WLn. On the other hand, a high voltage of 7 V is applied to the selected bit lines from the write load circuit 16. As a result, 4 bit data can be written in the memory cells selected by the row decoder circuit 6 and the column decoder circuit 15.

In data read, on the other hand, the supply voltage Vcc is applied to the inverter circuit 22 of the selected one of the word select lines WL1 to WLn. Data of the selected bit lines are sensed by the sense amplifier 8 and read as 4 bit internal data D*1 to D*4.

FIG. 23 is a detailed circuit diagram showing the address latch circuit 4 shown in FIG. 20, in which the addresses A*0 to A*2 are denoted by address A*i (i=0 to 2). Further, the addresses AL*0 to AL*2 are denoted by address AL*i. The address A*i is inputted to a switched inverter 27 through an inverter 32. On the other hand, the internal signal A is inputted to the switched inverter 27 and a switched inverter 28 directly or after inverted through an inverter 33. Under control of the internal signal A, the switched inverter 27 outputs an inversion output of the inverter 32 when the signal A is at the "L" level, and sets its output to a high impedance when at the "H" level. The output of the switched inverter 27 is given to the inverter 34 and the switched inverter 28.

The output of the inverter 34 is inverted through the inverter 35 and then outputted as an address AL*i. Further, the input of the inverter 35, that is, the output of the inverter 34 is returned to the input of the inverter 34 through the switched inverter 28. The switched inverter 28 sets its output to a high impedance when the internal signal A is at the "L" level, but outputs its inverted input when at the "H" level. In other words, when the internal signal is at the "H" level, the switched inverter 28 and the inverter 34 both have a self-holding function. Here, the output of the inverter 34 is outputted as an inversion address/AL*i.

In the above-mentioned circuit construction, the address latch circuit 4 outputs an address A*i, as it is, as an address AL*i and an inversion address/AL*i when the internal signal A is at the "L" level, but holds the address A*i immediately before the internal signal A changed to the "H" level by the switched inverter 28 and then outputs the held address AL*i and the held inversion address/AL*i when the internal signal A changes to the "H" level.

FIG. 24 is a circuit diagram showing the block decoder 3 shown in FIG. 20. In the same way as in FIG. 24, all the combinations of the addresses AL*i and the inversion addresses/AL*i are inputted to NAND gates 29, respectively. The outputs of the NAND gates 29 are inputted to NAND gates 30, respectively together with the internal signal B inputted through an inverter 36.

In other words, the addresses AL*i and the inversion addresses/AL*i are decoded by the NAND gates 29, and the decoded results are outputted through the NAND gates 30. When the internal signal B is at the "L" level, the outputs of the NAND gates 30 are enabled to the "L" level. When the internal signal B is at the "H" level, however, the block select signals EA1 to EA8 are all fixed at the "H" level.

FIG. 25 is a circuit diagram showing one of the cell source voltage supply blocks CSC1 to CSC8 for constituting the cell source voltage supply circuit 2 shown in FIG. 20, in which the block select signals EA1 to EA8 are inputted to a NAND gate 37 together with the internal signal C as block select signal EAi (i=1 to 8). The output of the NAND gate 37 is inputted to the gates of transistors 38 and 45 and further to an inverter 42. The output of the inverter 42 is connected to the gate of a transistor 39. The drain of the transistor 38 is connected to the drain of a transistor 40 (whose source is connected to an external voltage Vpp) and to the gate of a transistor 41 (whose source is connected to the external voltage Vpp). The drain of the transistor 39 is connected to the gate of the transistor 40 and the drain of the transistor 41. Further, the drain of the transistor 41 is connected to the gate of a transistor 44 connected to the drain of the transistor 45. The source of the transistor 44 is connected to the source of the transistor 43 having a gate to which an UHE of 15 V is inputted and a drain to which the external voltage Vpp is connected.

When the block select signal EAi and the internal signal C are both not at the "H" level, the output of the NAND gate 37 is at the "H" level, and the output of the inverter 42 is at the "L" level. As a result, the transistors 38 and 45 are both turned on, and the transistor 39 is turned off. When the transistor 38 is turned on, since the transistor 41 is turned on, the external voltage Vpp is given to the gate of the transistor 44. Therefore, the transistor 44 is turned off, so that the voltage applied from the cell source voltage supply block CSCi to the cell source line of the cell block i becomes zero. Further, since the drain voltage of the transistor 41 is also given to the gate of the transistor 40, the transistor 40 is kept turned off.

On the other hand, when the block select signal EAi and the internal signal C are both at the "H" level, the output of the NAND gate 37 is at the "L" level and the output of the inverter 42 is at the "H" level. As a result, the transistors 38 and 45 are both turned off and the transistor 39 is turned off. Here, when the transistor 38 is turned off and the transistor 39 is turned on, the transistor 41 is turned off and the transistor 40 is turned on. When the transistor 40 is turned on, since the gate of the transistor 44 changes to the "L" level, the transistor 44 is turned on, so that the external voltage Vpp is outputted to the drain of the transistor 44 from the source of the transistor 43 through the transistor 44. Accordingly, the voltage applied from the cell source voltage supply block CSCi to the cell source line of the cell array block i becomes the external voltage Vpp, that is, a high voltage of 15 V for erasure operation.

FIGS. 26A and 26B are circuit diagrams showing the command input circuit 12 shown in FIG. 20. In FIGS. 26A and 26B, the data inputs Din1 to Din4 are inputted to a NAND gate 46. The output of the NAND gate 46 is outputted as the internal signal A through switching gates 47, 48, 49 and 50, to each of which a control signal CME is applied directly and via an inverter 51. Here, the respective inputs of the switch gates 48 and 50 are connected to a transistor 66 having a gate to which a reset signal RST is applied. The drain of the transistor 66 is connected to the switching gate 49 through a series circuit composed of inverters 52 and 53 and further to the output side of the transistor 50 via a series circuit composed of inverters 54 and 55.

In the above-mentioned system, when the bits of data inputs Din1 to Din4 are all at "1", that is, when the command data is "F", the internal signal A is to be outputted.

On the other hand, the data input Din1 is inverted by an inverter 68 and then inputted to a NAND gate 56. The data inputs Din 2 to Din4 are directly inputted to the NAND gate 56. The output of the NAND gate 56 is outputted as the internal signal B through switching gates 57, 58, 59 and 60 to each of which a control signal CME is applied directly and via an inverter 61. Here, the respective inputs of the switch gates 58 and 60 are connected to a transistor 67 having a gate to which a reset signal RST is applied. The drain of the transistor 67 is connected to the switching gate 59 through a series circuit composed of inverters 62 and 63 and further to the output side of the transistor 60 via a series circuit composed of inverters 64 and 65.

In the above-mentioned system, when the data inputs Din1 is at "0" and Din2 to Din4 are at "1", that is, when the command data is "E", the internal signal B is to be outputted.

Here, the internal signal A corresponding to the command data "F" corresponds to block erasure mode, and the internal signal B corresponding to the command data "E" corresponds to chip erasure mode.

FIG. 27 is a circuit diagram showing the verify circuit shown in FIG. 20. In FIG. 27, NAND gates 69 and 70A constitute a circuit for detecting all "1" of the internal data D*1 to D*4. Therefore, when the internal data D*1 to D*4 are all at "1" and further the internal signal D inputted to an inverter 72A is at "1", the inputs of a NOR circuit 71A are all set to "0", so that a verify signal VRF of "1" is outputted from the NOR circuit 71A.

The operation of the circuits shown in FIGS. 20 to 27 will be described hereinbelow with reference to FIGS. 28 to 31.

Addresses A0 to An for accessing the cell array 1 are given from the outside to the address buffer circuit 5. In the normal operation, that is, when the internal signal C is not outputted, the addresses A0 to An are given to the inside as addresses A*0 to A*n.

The addresses A*0 to A*2 of the column addresses A*0 to A*3 in the addresses A0 to An are given to the address latch circuit 4. In the normal operation, however, since the internal signal A is not outputted, the addresses are outputted as addresses AL*0 to AL*2, as they are as.

These addresses AL*0 to AL*2 are given to the block decoder 3, decoded when the internal signal B is not outputted, and then given to the cell source voltage supply circuit 2 as the block select signals EA1 to EA8. In the normal operation, however, since the internal signal C is not outputted, the operation of the cell source voltage supply circuit 2 is kept locked.

The row addresses A*6 to A*n of the addresses A*0 to A*n are given to the row decoder 6. In the normal operation, since the internal signal C is not outputted, these addresses are decoded as they are, and then given to the cell array 1 through the word select lines WL1 to WLn as a row select signal. As a result, a word select line WL can be selected in the cell array 1.

Further, with respect to the column addresses A*0 to A*3 of the addresses A*0 to A*n, the column address A*3 is directly given to the column decoder circuit 15, and the column addresses AL*0 to AL*2 are given to the column decoder circuit 15 via the address latch circuit 4 as the addresses AL*0 to AL*2. In the normal operation, since the internal signal C is not outputted, these addresses are decoded as they are, and then given to the column gate transistor group 7 as the column select signals. As a result, 4 bit lines of the word select lines are selected in the cell array 1, and the selected bit lines are connected to the sense amplifier 8 and the write load circuit 16.

As described above, the specific cells of the cell array 1 are selected and connected to the sense amplifier 8 and the write load circuit 16. That is, data are written in the selected cells through the write load circuit 16, and data are read from the selected cells through the sense amplifier 8.

In the data write, the data inputs given to the input/output circuit 9 are given to the write load circuit 16 as the data inputs Din1 to Din4 to activate the selected bit lines, so that the data inputs Din1 to Din4 are written in the selected cells of the cell array 1.

On the other hand, the levels of the bit lines connected to the selected cells of the cell array 1 are read by the sense amplifier 8, and then given to the input/output circuit 9 as the data D*1 to D*4, so that the data are outputted to the outside as the data output.

The above-mentioned data write and read operation is controlled by the read/write control circuit 14.

Now, in the non-volatile semiconductor memory device as described above, when data in the cell array 1 are erased, it is possible to select any one of chip erasure mode and block erasure mode.

First, the operation of when all the bits of the chip are erased will be described hereinbelow with reference to a flowchart shown in FIG. 28 and a timing chart shown in FIG. 29. Here, in FIG. 29, (a) denotes the external voltage Vpp; (b) denotes the external OE signal; (c) denotes the control signal CME; (d) denotes the external CE signal; (e) denotes the timing at which data inputs Din1 to Din4 are inputted as commands; (f) denotes the statuses (levels) of the data inputs Din1 to Din4; (g) denotes the internal signal A; (h) denotes the internal signal B; (i) denotes the internal signal C; (j) denotes the internal signal D; (k) denotes the verify signal VRF; (1) denotes the address A*0; (m) denotes the address A*1; (n) denotes the address A*n; (o) denotes the word select line WL1; (p) denotes the word select line WLn; (q) denotes the column decode signal g1; (r) denotes the column decode signal (s) denotes the column decode signal g8; (t) denotes the column decode signal h1; (u) denotes the column decode signal h2; and (v) denotes all the cell source line voltages of the cell array 1, respectively.

First, at time t1, simultaneously when the external voltage Vpp rises up to 12.5 V as shown by (a) in FIG. 29, the external OE signal changes to the "H" level as shown by (b). As a result, the control signal CME of the read/write control circuit 14 changes to the "H" level as shown by (c). Then, command data are fed to the data inputs Din1 to Din4 of the input/output circuit 9 as shown by (e). In the case of the chip erasure, as shown by (e), these command data are "E".

With respect to the processing procedure, in step S1, the command data "E" are inputted, and then control (i.e., the processing) proceeds to step S2 to start erasure operation.

Then, as shown by (d) in FIG. 29, the external signal CE is inputted as a negative signal. When the external CE signal rises at time t2, the command data "E" are latched by the command input circuit 12, so that the internal signals B and C outputted by the command input circuit 12 change to the "H" level as shown by (h) and (i) to start erasure period in step S2. In this case, all the block select signals EA1 to EA8 extending from the block decoder 3 change to the "H" level on the basis of the internal signal B. At the same time, in step S3, the counter circuit 10 is set by the automatic erase control circuit 13.

As a result, in step S4, the internal addresses A*0 to A*n are set to "0", and further the outputs of the row decoder circuit 6 and the column decoder circuit 15 are set to the non-select status on the basis of the internal signal C, respectively.

Further, on the basis of the internal signal C, since 12 V is applied to all the cell source lines of the cell array 1 through the cell source voltage supply circuit 2 as shown by (v) in FIG. 29, in step S5 all the cell blocks 1 to 8 of the cell array 1 are erased. In this case, the erasure period is about 10 ms as shown by (i) in FIG. 29. In this erasure operation, since the cell source line voltages of all the cell array blocks 1 to 8 of the cell array 1 are set to 12 V by the external voltage Vpp, electrons are extracted from the floating gates of the memory cells, so that the cells can be erased.

When the erasure period ends at time t3, the internal signal C returns to the "L" level as shown by (i) in FIG. 29, and the internal signal D returns to the "H" level as shown by (j) in FIG. 29, so that the verify period starts. In this period, in step S6, the cell source voltage applied by the cell source voltage supply circuit 2 is zeroed to stop erasure operation.

In the verify period, the internal addresses A*0 to A*n are advanced by the counter circuit 10 to execute the verify operation in step S7 and the data "1" check in step S8. Beginning from the first address of the chip, the addresses A*0 to A*n are checked in sequence as shown by (1), (m) and (n) in FIG. 29. As a result, the word select lines WL1 to WLn change as shown by (o) and (p), and the column decode signals g1 to g8 and h1 and h2 change in sequence as shown by (q), (r), (s), (t) and (u) in FIG. 29. In correspondence to the above-mentioned address change, cell data in the respective cell array 1 are read. After the data have been erased completely, the data D*1 to D*4 read through the sense amplifier 8 are all at "1". In other words, as far as the data are erased completely, as shown by (k) in FIG. 29, the verify signal VRF is outputted by the verify circuit 11 to the counter circuit 10. Here, if the address is not the final address in step S10, control proceeds from step S10 to step S9 to increment the count value of the counter circuit 10, so that the address is advanced by 1. As a result, data at the succeeding address are read through the sense amplifier 8, and the read data are also verified.

Now, as the result of the final address check in step S10, if the erasure is not sufficient, the verify circuit 11 does not output the verify signal VRF. In this case, control returns to step S5 to execute the erasure operation again. That is, at timing t4, as shown by (j) and (i) in FIG. 29, the internal signal D is set to "L" level and the internal signal C is set to "H" level, in quite the same way as the operation after the time t2.

After the re-erasure operation ends at time t5, the verify period starts again to check the perfect erasure operation beginning from the first. As the result of this check, when the erasure is imperfect, control returns to step S5 to execute the erasure and verify operation again. As the result of verify, when the erasure is perfect and the address reaches the final address in step S10, control determines that all the data in-the chip have been erased completely, so that the chip erasure operation ends.

Here, in the above-mentioned verify period, as far as the erasure is executed perfectly, the intervals of the address advance is about 2 microseconds.

In other words, assuming that the address advance operation (2 microseconds) is repeated by $10^6$ times; the erasure operation (10 ms) is repeated 100 times; and the verify result discrimination (3 microseconds) is repeated 100 times, it takes about 3 seconds to erase all the bits in this chip erasure mode.

The operation of when data of the cell array 1 are erased in unit of block (1 to 8) will be described hereinbelow with reference to a flowchart shown in FIG. 30 and a timing chart shown in FIG. 31. Here, in FIG. 31, (a) denotes the external voltage Vpp; (b) denotes the external OE signal; (c) denotes the control signal CME; (d) denotes the external CE signal; (e) denotes the timing at which data inputs Din1 to Din4 are inputted as commands; (f) denotes the block addresses AL*0 to AL*2; (g) denotes the status (level) of the data input Din1 to Din4; (h) denotes the internal signal A; (i) denotes the internal signal B; (j) denotes the status (level) change of the address AL*0, the inversion addresses/AL*1 and/AL*2; (k) denotes the status change of the inversion address /AL*0 and the address AL*1 and AL*2; (1) denotes the status of the block select line EA2; (m) denotes the status of the block select signal EA1 and EA3 to EA8; (n) denotes the internal signal C; (o) denotes the internal signal D; (p) denotes the verify signal VRF; (q) denotes the address A*0; (r) denotes the address A*1; (s) denotes the address A*n; (t) denotes the word select line WL1; (u) denotes the word select line WL2; (v) denotes the word select line WLn; (w) denotes the column decode signal h1; (x) denotes the column decode signal h2; (y) denotes the column decode signal g2; (z) denotes the column decode signal g1 and g3 to g8; (X) denotes the cell source line voltage of the cell array block 2 of the cell array 1; and (Y) denotes the cell source line voltage of the cell array blocks 1 and 3 to 8 of the cell array 1, respectively.

First, at time t1, simultaneously when the external voltage Vpp rises up to 12.5 V as shown by (a) in FIG. 31, the external OE signal changes to the "H" level as shown by (b). As a result, the control signal CME of the read/write control circuit 14 changes to the "H" level as shown by (c).

Then, command data are fed as the data inputs Din1 to Din4 from the input/output circuit 9 as shown by (e). In the case of the block erasure, these command data are "F", as shown in step S1 in FIG. 30.

In accompany with the input of the command data "F", the addresses A0 to A2 of the input addresses A0 to An are latched by the address latch circuit 4 as the block addresses A*0 to A*2, as shown by (f).

Then, the external CE signal is inputted as a negative signal, as shown by (d). When the external CE signal rises at time t2, control proceeds to step S2. At this time, the address latch circuit 4 latches the block addresses A*0 to A*2. The latched block addresses AL*0 to AL*2 are decoded by the block decoder 3 to select one of the block select signals EA1 to EA8. As a result, one of the cell source voltage supply blocks CSC1 to CSC8 of the cell source voltage supply circuit 2 is selected for erasure. In this example, as shown by (j) and (k), the block address AL*0 is "1" and the block addresses A*1 and A*2 are "0" Therefore, the block select signals EA1 to EA8 (the output of the block decoder 3) are as follows: the block select line EA2 is activated as shown by (1), and the block select lines EA3 to EA8 are deactivated as shown in by (m).

At time t2, when the command data "F" are latched by the command input circuit 12, the internal signals A and C of the command input circuit 12 change to the "H" level as shown by (h) and (n). At this time, the erasure operation starts in step S3 in FIG. 30.

In step S4, the counter circuit 10 is set by the automatic erase control circuit 13. As a result, in step S5, the internal addresses A*3 to A*n are zeroed as shown by (q), (r) and (s), so that the row decoder circuit 6 and the column decoder circuit 15 are both set to the nonselect status on the basis of the internal signal C.

In step S6, on the basis of the internal signal C, a voltage of 12 V is applied from one of the cell source voltage supply blocks CSC1 to CSC8 (in this example, the block CSC2) selected by the block select signals EA1 to EA8 to the cell source line of the corresponding one (the second block) of the cell array blocks 1 to 8 of the cell array 1, as shown by (X). Further, no erase voltage is applied to the other cell array blocks 1 to 8, as shown by (Y). As a result, only one of the block of the cell array blocks 1 to 8 is erased in step S4. In this erasure operation, the erasure period is bout 10 ms.

When the erasure period ends at time t3, the internal signal C returns to the "L" level as shown by (n), and the internal signal D returns to the "H" level as shown by (o), so that the verify period starts. In this case, in step S7, the cell source voltage applied by the cell source voltage supply block CSC2 of the cell source voltage supply circuit 2 is set to 0 V to stop erasure operation as shown by (X).

In the verify period, the internal addresses A*3 to A*n are advanced by the counter circuit 10 to execute the verify in step S8 and the data "1" check in step S10, by reading data from the selected block. In this case, the addresses A*3 to A*n are incremented as shown by (q), (r) and (s); the word select lines WL1 to WLn change as shown by (t), (u) and (v); and the column select signals h1 and h2 change as shown by (w) and (x). Here, with respect to the addresses A*0 to A*2, since the block address AL*0 is "1" and the block addresses A*1 and A*2 are "0", the column decode signal g2 changes to the "H" level as shown by (y), and the column decode signals g1 and g3 to g8 are kept unchanged at the "L" level as shown by (z). As far as the erasure is executed perfectly at the respective addresses, since the data D*1 to D*4 read through the sense amplifier 8 are all "1", the verify circuit 11 outputs the verify signal VRF as shown by (p). The outputted verify signal VRF is given to the counter circuit 10. Here, when the address of the counter circuit 10 is not the final address, control proceeds from step S11 to step S9 to increment the count value of the counter circuit 10, so that the address is advanced by 1. As a result, data at the succeeding address are read through the sense amplifier 8, and the read data are also verified.

Now, as the result of the data check in step S8, the erasure is not sufficient, the verify circuit 11 does not output the verify signal VRF. In this case, control returns to step S6 to execute the erasure operation again. That is, at timing t4, the internal signal D is set to the "L" level as shown by (o) and the internal signal C is set to "H" level as shown by (n), in quite the same way as the operation after the time t2.

After the re-erasure operation ends at time t5, the verify period starts again to check the perfect erasure beginning from the first address of the block. As the result of verify, when the erasure is perfect and the address reaches the final address in step S11, the operation ends.

Here, in the above-mentioned verify period, as far as the erasure operation is executed perfectly, the intervals of the address advance is about 2 microseconds.

In other words, assuming that the address advance operation (2 microseconds) is repeated by $1.28 \times 10^5$ times; the erasure (10 ms) is repeated 100 times; and the verify result discrimination (3 microseconds) is repeated 100 times, it takes about 1.25 seconds to erase all the bits of the block to be erased.

In the prior art non-volatile semiconductor memory device as described above, the chip erasure and the block erasure can be selectively executed. Accordingly, in the chip test, it is necessary to check each of these functions. In the case of the block erasure, however, it takes about 1.25 seconds to check only one block. Therefore, it takes about 10 second to check all the blocks (because 8 blocks in this embodiment). This time required for semiconductor device check is relatively long, which cannot be neglected when the memory of large capacity is manufactured in the future. Therefore, there exists a need of shortening the test time for confirming the block erasure function of the memory chip, from the standpoint of cost reduction.

SUMMARY OF THE INVENTION

With these problems in mind, therefore, it is the object of the present invention to provide a non-volatile semiconductor memory device which can shorten the test time required to check the block erasure function of the memory device.

To achieve the above-mentioned object, the present invention provides a non-volatile semiconductor memory device, comprising: a memory cell array having a plurality of cell blocks, each of the cell blocks being composed of a plurality of memory cells arranged roughly into a matrix pattern, each of the memory cells having a floating gate to or from which electrons are injected or extracted to write or erase data; a block decoder responsive to a block address, for outputting a decode signal to select a cell block corresponding to the block address from the cell blocks, the memory cells of the selected block being erased simultaneously; when a control signal is inputted thereto, said block decoder outputting the decode signal to select all the cell blocks for erasure of the memory cells of all the cell blocks simultaneously, irrespective of the block address; and decode signal reading means for outputting the decode signal to the outside, the decode signal being applied to the cell blocks and additionally in parallel to said decode signal reading means themselves and further outputted to the outside through said decode signal reading means themselves.

Further, the present invention provides a non-volatile semiconductor memory device, comprising: a memory cell array having a plurality of cell blocks, each of the cell blocks being composed of a plurality of memory cells arranged roughly into a matrix pattern, sources of the memory cells being connected in common as a common source line, each of the memory cells having a floating gate to or from which electrons are injected or extracted to write or erase data; a block decoder responsive to a block address, for outputting a decode signal to select a cell block corresponding to the block address from the cell blocks, the memory cells of the selected block being erased simultaneously; a source voltage supplying circuit for supplying a source voltage to each common source line of each of the cell blocks in such a way that the source voltage supplied to the cell block selected by said block decoder and the source voltage supplied to the cell blocks not selected thereby are different from each other; and reading means for detecting potential on bit lines for each cell block, drains of the memory cells arranged in each of the cell blocks being connected in parallel to each of the bit lines.

Further, the present invention provides a non-volatile semiconductor memory device, comprising: a memory cell array having a plurality of cell blocks, each of the cell blocks being composed of a plurality of memory cells arranged roughly into a matrix pattern, sources of the memory cells being connected in common as a common source line, each of the memory cells having a floating gate to or from which electrons are injected or extracted to write or erase data; a block decoder responsive to a block address, for outputting a decode signal to select a cell block corresponding to the block address from the cell blocks, the memory cells of the selected block being erased simultaneously; a source voltage supplying circuit for supplying a source voltage to each common source line of each of the cell blocks in such a way that the source voltage supplied to the cell block selected by said block decoder and the source voltage supplied to the cell blocks not selected thereby are different from each other; and source potential detecting circuits each for detecting potential on each of the common source lines and for checking whether said source voltage supplying circuit is operated according to the block address to apply an appropriate voltage to the selected block and the nonselected blocks, respectively; when all the cell blocks are determined to be erasable simultaneously, data being decided to be erasable for each block.

The decoding means decodes the block addresses and outputs the output signals for selecting one unit of block cell arrays. Further, this output signals can be compulsorily switched to the other signals for selecting all the units of the block cell arrays. These signals can be outputted by the outputting means to the outside. Accordingly, it is possible to check whether the decoding means is operating normally or not on the basis of the contents of these output signals.

On the basis of the output signals of the decoding means, a predetermined unit of the block cell array can be selected. In the selected unit of the block cell array, a predetermined source voltage is supplied from the source voltage supplying means to the sources of the memory cells. Therefore, it is possible to discriminate whether a predetermined source voltage is suitably applied or not by detecting the bit line potentials by the reading means. In other words, it is discriminate whether the source voltage supplying means operates normally or not.

The testing means tests the all bit erasure test and the block decoder test. When all the bits can be erased and when the decoding means can select the respective units of the block cell array properly, it is determined that the erasure operation for each unit of the block cell array can be made properly.

BRIEF DESCRIPTION OF THE DRAWINGS

FIG. 6 is an illustration for assistance in explaining a difference in device test time between the conventional memory device and the first embodiment of the present invention;

FIG. 9 is a table for assistance in explaining the operation modes of the circuit shown in FIG. 8;

DETAILED DESCRIPTION OF THE EMBODIMENTS

The embodiments of the present invention will be described hereinbelow with reference to the attached drawings.

Figure 1:
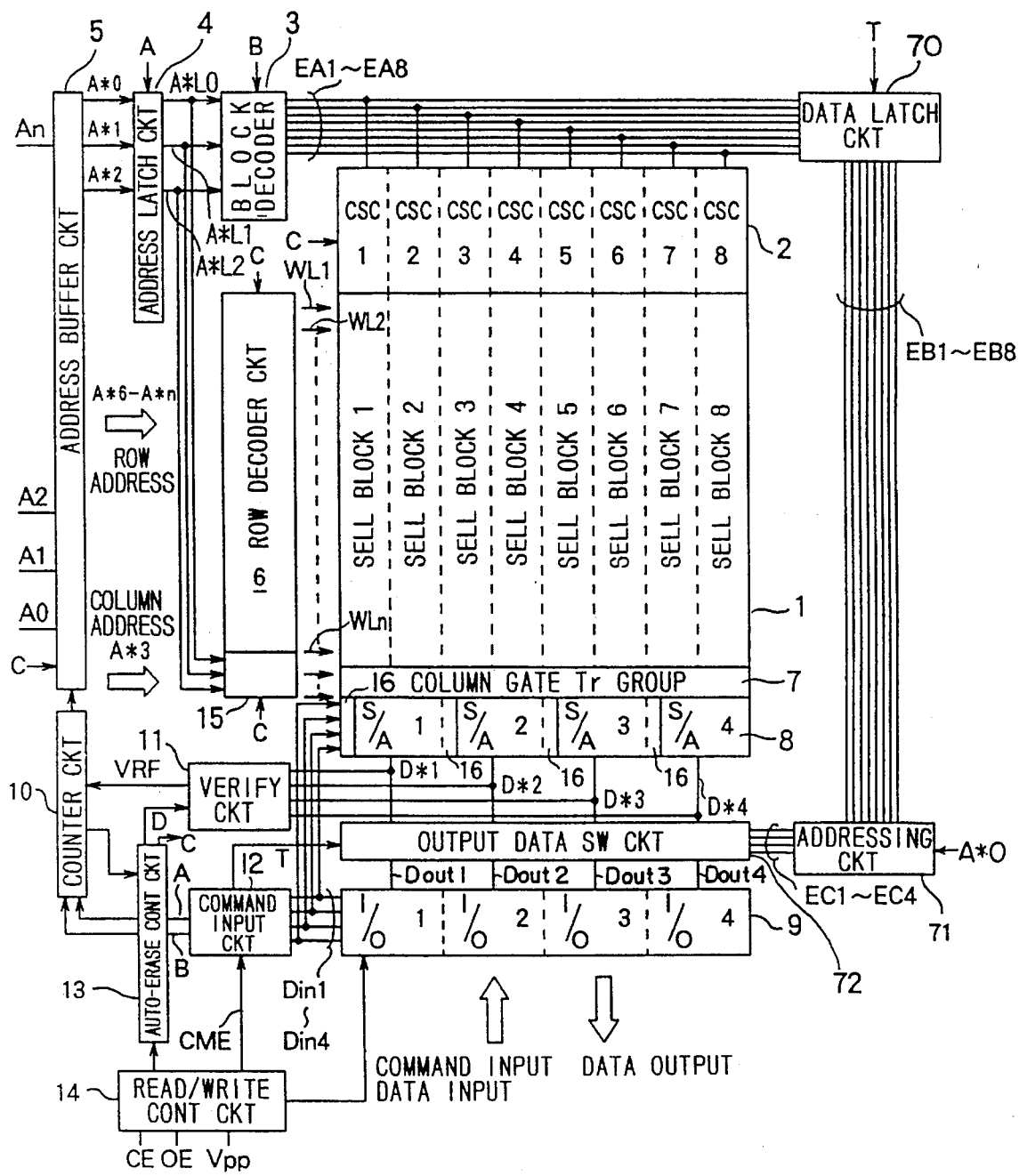
FIG. 1 is a block diagram showing a first embodiment of the non-volatile semiconductor memory device according to the present invention.
Figure 20:
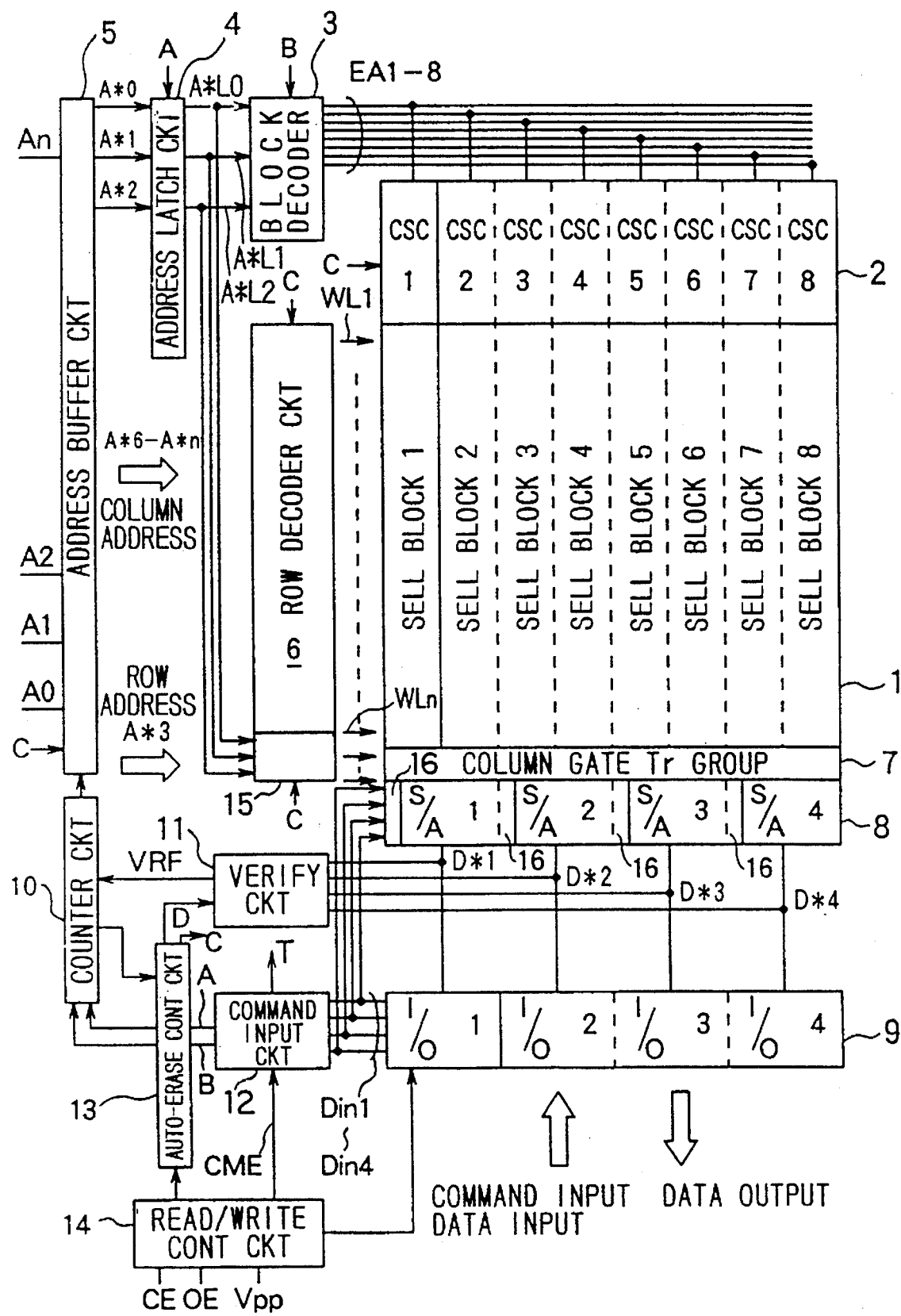
FIG. 20 is a block diagram showing a conventional nonvolatile semiconductor memory device.
Figure 21:
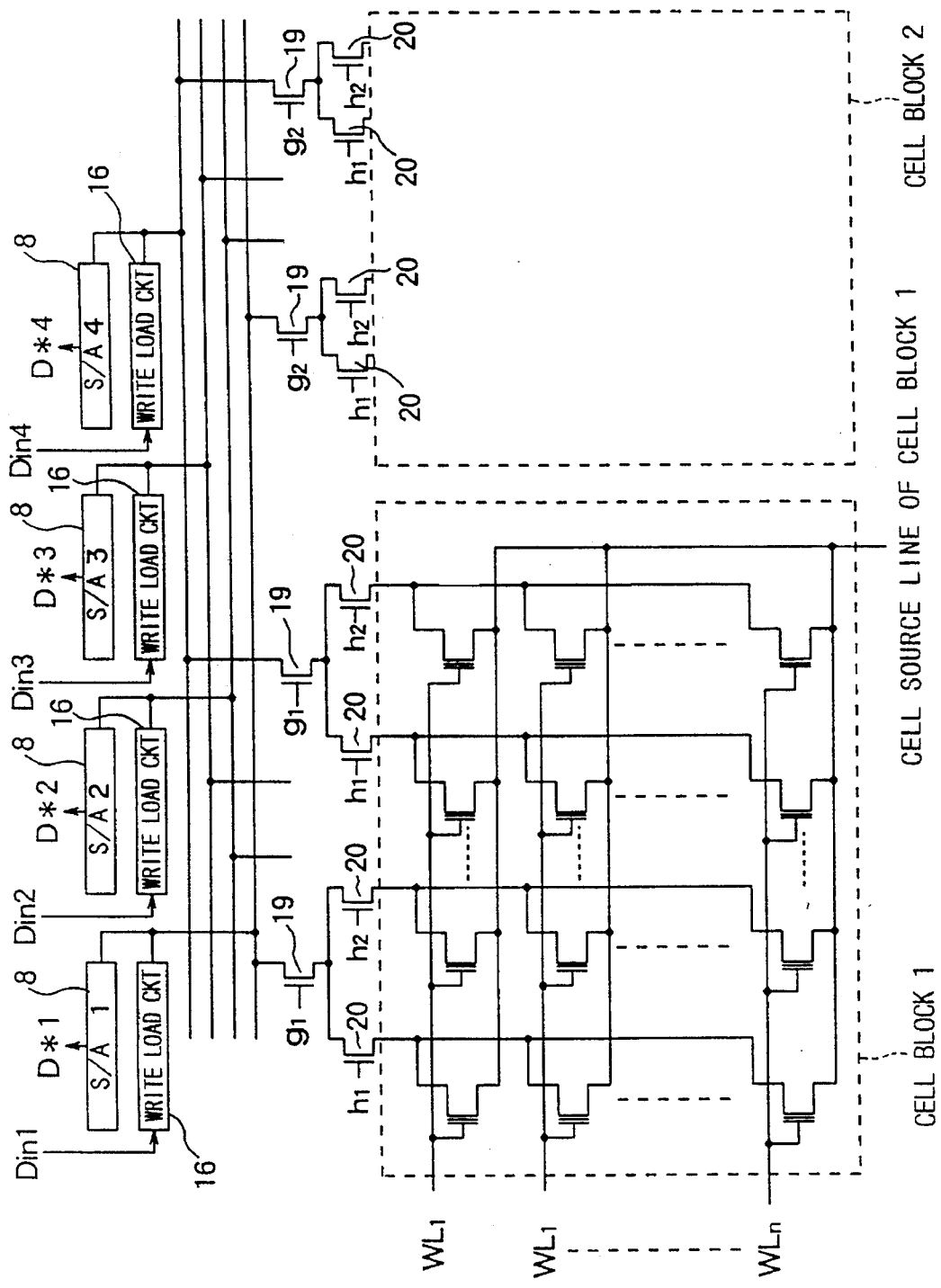
FIG. 21 is a circuit diagram showing a cell array, sense amplifiers, and the write load circuit shown in FIG. 20.
Figure 22:
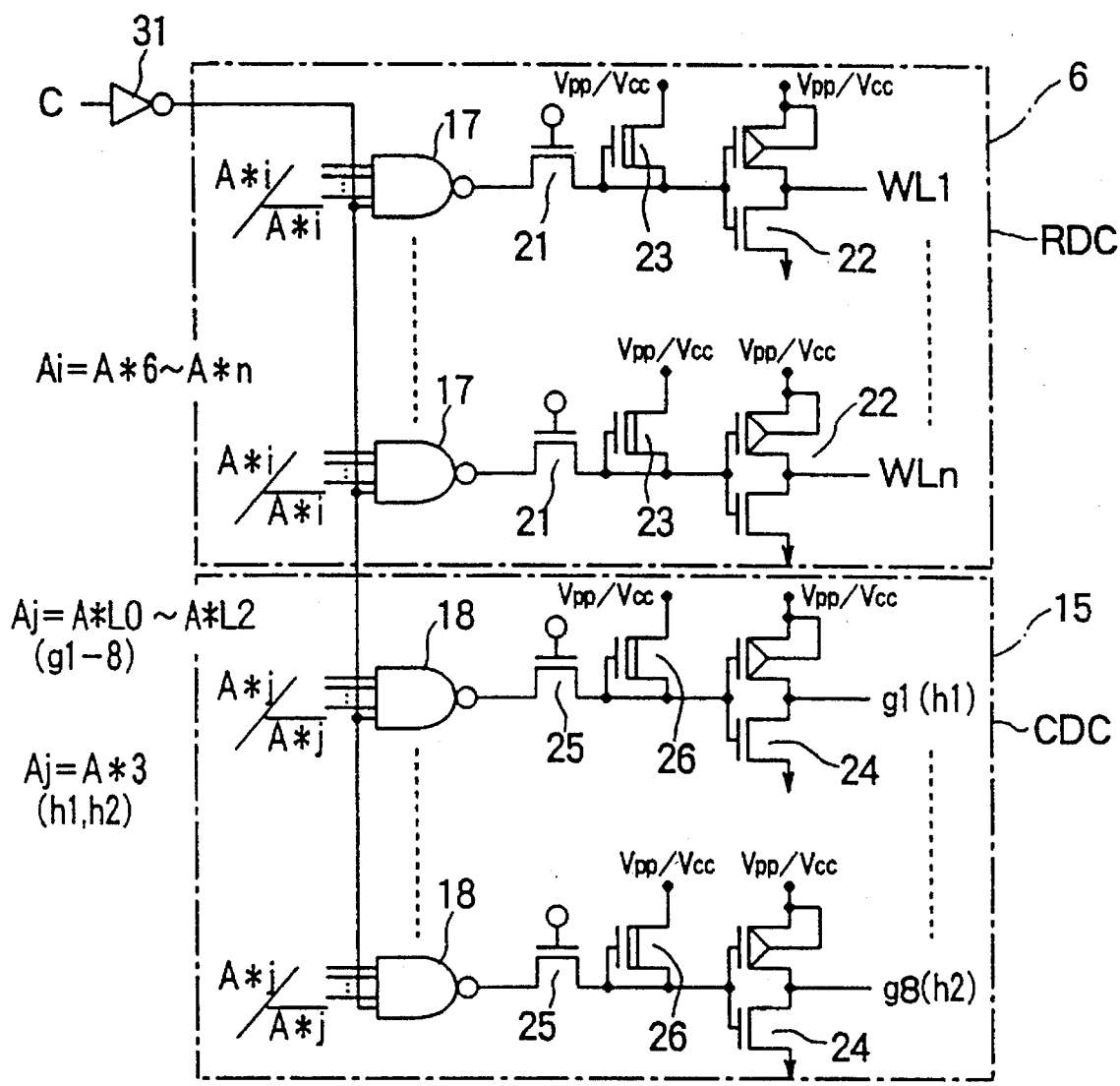
FIG. 22 is a circuit diagram showing a row decoder circuit and a column decoder circuit shown in FIG. 20.

FIG. 1 shows a first embodiment of the non-volatile semiconductor device according to the present invention. As shown in FIG. 1, a data latch circuit 70 latches block select signals EA1 to EA8 outputted by a block decoder 3 on the basis of an internal signal T outputted by a command input circuit 12, and outputs select latch signals EB1 to EB8. An addressing circuit 71 inputs the select latch signals EB1 to EB8 and an address A*0, and outputs addressing signals EC1 to EC4. An output data switching circuit 72 interposed between a sense amplifier 8 and an input/output circuit 9 switches internal data D*1 to D*4 sensed by the sense amplifier 8 to the addressing signals CE1 to CE4 outputted by the addressing circuit 71 or vice versa on the basis of the internal signal T of the command input circuit 12, and further outputs the switched data to the input/output circuit 9 as output data Dout1 to Dour4. Here, the internal signal T is outputted by the command input circuit 12 as a signal indicative of a test mode. The construction other than the above is substantially the same as with the case of the conventional semiconductor memory device shown in FIG. 20, so that the same reference numerals have been retained for the similar elements which have the same functions as the conventional memory device without repeating the similar description thereof.

Figure 2:
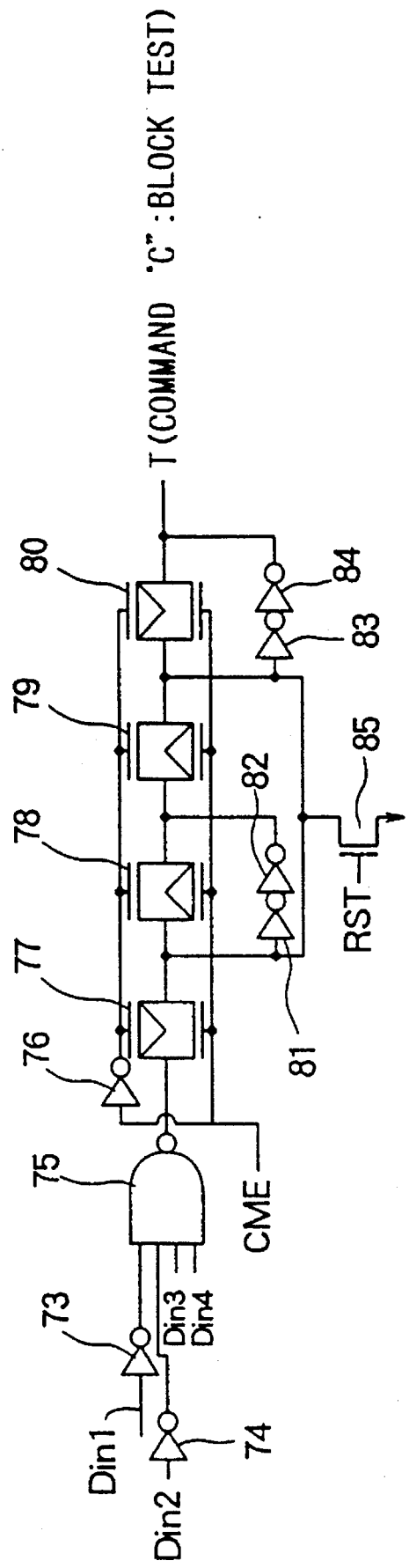
FIG. 2 is a partial circuit diagram showing a command input circuit shown in FIG. 1.

FIG. 2 is a circuit diagram showing the command input circuit 12 shown in FIG. 1. As shown in FIG. 2, with respect to the data Din1 to Din4 of the input/output circuit 9, the data inputs Din1 and Din2 are inputted to a NAND gate 75 via inverters 73 and 74 respectively, and the data inputs Din3 and Din4 are inputted to the same NAND gate 75 directly. In other words, the command input circuit 12 discriminates the command data "C" of the data inputs Din1 to Din4 inputted through the NAND gate 75. Here, the command data "C" are a signal indicative of the block test. The output of the NAND gate 75 is outputted through switching gates 77, 78, 79 and 80 (to each of which a control signal CME is applied directly or via an inverter 76) as the internal signal T. The inputs of the switching gates 78 and 80 are connected to a transistor 85 (to a gate of which a reset signal RST is inputted). The input and output of the switch gate 78 are connected to each other via a series circuit composed of two inverters 81 and 82, and the input and output of the switch gate 80 are connected to each other via a series circuit composed of two inverters 83 and 84. As a result, the command input circuit 12 outputs the internal signal T when the command data "C" is discriminated on the basis of the control signal CME, but the outputted internal signal T is stopped compulsorily on the basis of the reset signal RST.

Figure 3:
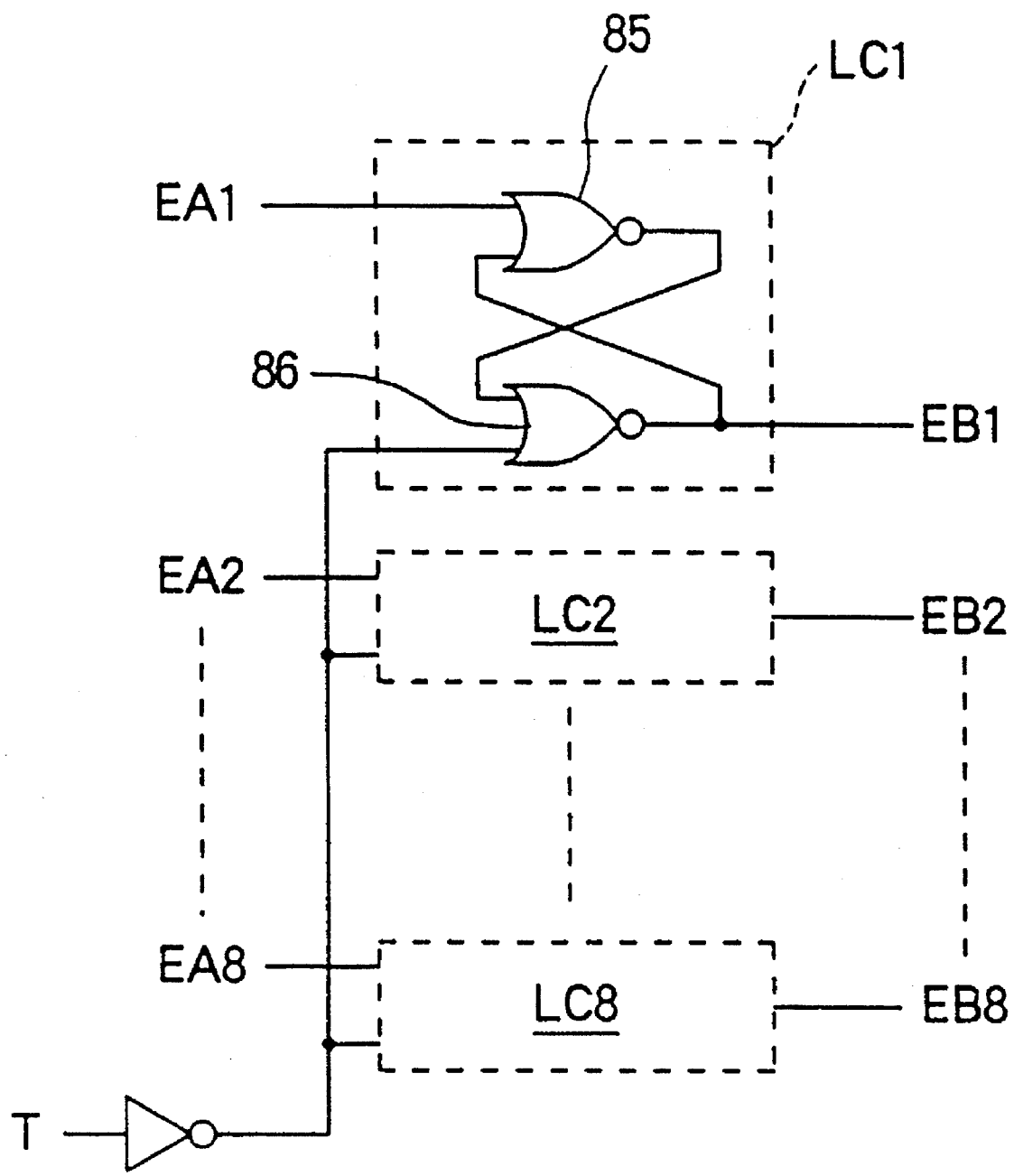
FIG. 3 is a circuit diagram showing a data latch circuit shown in FIG. 1.

FIG. 3 is a circuit diagram showing the data latch circuit 70 shown in FIG. 1. In FIG. 3, each of latch blocks LC1 to LC8 is constructed by cross-connecting two NOR gates 85 and 86, and each of the block select signals EA1 to EA8 is inputted to the input side of the NOR gate 85 of each of the latch blocks LC1 to LC8. On the other hand, the internal signal T is inputted to the input of the NOR gate 86 of each of the latch blocks LC1 to LC8. The select latch signals EB1 to EB8 are outputted as the outputs of the NOR gates 86 of the latch blocks LC1 to LC8.

In the circuit construction as described above, the data latch circuit 70 latches the block select signals EA1 to EA8 on the basis of the internal signal T, and outputs the select latch signals EB1 to EB9.

Figure 4:
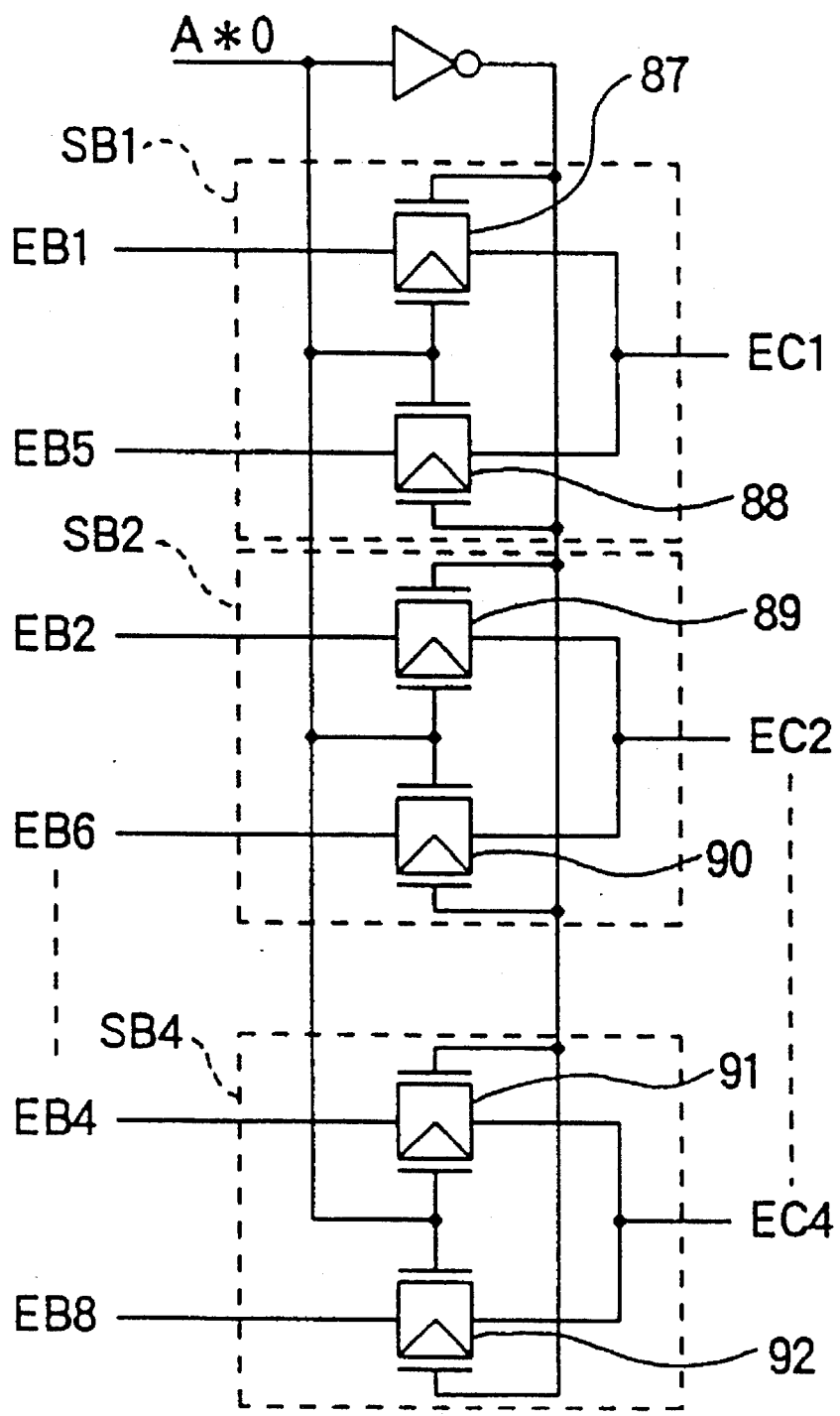
FIG. 4 is a circuit diagram showing an addressing circuit shown in FIG. 1.

FIG. 4 is a circuit diagram showing the addressing circuit 71 shown in FIG. 1. As shown in FIG. 4, the select latch signals EB1, EB5; EB2, EB6; . . . ; EB4, EB8 are inputted to switch gates 87 to 92, respectively. The switch gates 87 and 88 constitute a switch block SB1; the switch gates 89 and 90 constitute a switch block SB2; . . . ; and the switch gates 91 and 92 constitute a switch block SB4, respectively. The address A*0 is inputted to the switch gates 87 to 92 as a control signal directly or via an inverter 93. The outputs of the switch blocks SB1 to SB4 are outputted as the addressing signals EC1 to EC4, respectively.

On the basis of the construction as described above, when the address A*0 is "0", the switch gates 87, 89, . . . , and 91 are turned on to select the select latch signals EB1 to EB4 and output the selected signals as the addressing signals EC1 to EC4. On the other hand, when the address A*0 is "1", the switch gates 88, 90, . . . , and 92 are turned on to select the select latch signals EB5 to EB8 and output the selected signals as the addressing signals EC1 to EC4.

Figure 5:
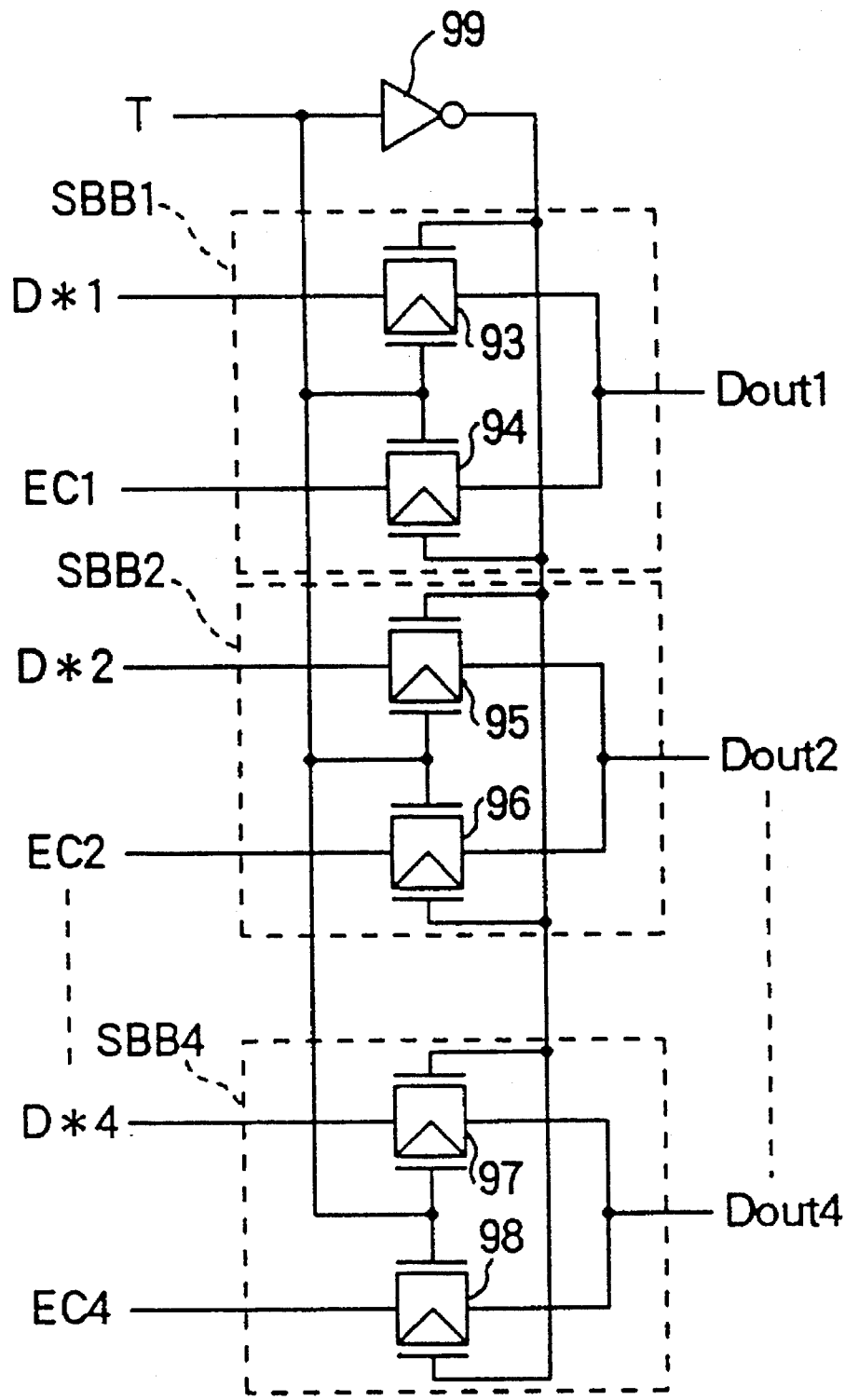
FIG. 5 is a circuit diagram showing an output data switch circuit shown in FIG. 1.

FIG. 5 is a circuit diagram showing the output data switching circuit 72 shown in FIG. 1. In FIG. 5, the internal data D*1 to D*4 are inputted to the switching gates 93, 95, . . . , and 97, respectively. On the other hand, the addressing signals EC1 to EC4 are inputted to switching gates 94, 96, . . . , and 98, respectively. The switching gates 93 and 94 constitute a switching block SBB1; the switching gates 95 and 96 constitute a switching block SBB2; . . . ; and the switching gates 97 and 98 constitute a switching block SBB4. The internal signal T is inputted to the switching gates 93 to 98 as a control signal directly or via an inverter 99. The outputs of the switch blocks SBB1 to SBB4 are outputted as the output data Dout1 to Dour4, respectively.

In the circuit construction as described above, when the internal signal is "0", the switch gates 93, 95, . . . , and 97 are turned on to select the internal data D*1 to D*4 and output the selected data as the output data Dout1 to Dour4. On the other hand, when the internal signal T is "1", the switch gates 94, 96, . . . , and 98 are turned on to select the addressing signals CE1 to CE4 and output the selected signals as the output data Dout1 to Dour4.

The operation of the device as described above will be described hereinbelow.

In the case of the chip erasure operation, since the command data "E" is inputted but the command data "C" is not inputted, the internal signal B is outputted from the command input circuit 12 but the internal signal T is not outputted therefrom. Accordingly, the operation is quite the same as with the case of the conventional memory device shown in FIG. 20, so that the detailed description thereof is omitted herein.

In the case of the block erasure operation, since the command data "F" is inputted but the command data "C" is not inputted, the internal signal A is outputted from the command input circuit 12 but the internal signal T is not outputted therefrom. Accordingly, the operation is quite the same as with the case of the conventional memory device shown in FIG. 20, so that the detailed description thereof is omitted herein.

Now, the block decoder test corresponding to the command data "C" will be described hereinbelow. The data inputs Din1 to Din4 are given to and latched by the command input circuit 12 as commands in correspondence to a rise of the external CE signal inputted to the read/write control circuit 14. In this case, the data inputs Din1 to Din4 correspond to the command data "C". As a result, the internal signal T changes to the "H" level, so that the internal mode of the chip is switched to the test mode.

On the basis of the internal signal T, the levels of the block select signals EA1 to EA8 (the outputs of the block decoder 3) are latched by the data latch circuit 70, and then outputted to the addressing circuit 71 as the 8-bit select latch signals EB1 to EBB.

On the basis of the status of the internal address A*0, the addressing circuit 71 selects 4 bits of the select latch signals EB1 to EB8. In other words, when the internal address A*0 is "0", the addressing circuit 71 selects the select latch signals EB1 to EB4 and outputs the selected signals as the addressing signals EC1 to EC4; and when the internal address A*0 is "1", the addressing circuit 71 selects the select latch signals EB5 to EB8 and outputs the selected signals as the addressing signals EC1 to EC4.

Where the chip is in the test mode, the addressing signals CE1 to CE4 are inputted to the output data switch circuit 72. Here, since the data switch circuit 72 selects the addressing signals EC1 to EC4 from the internal data D*1 to D*4 and the addressing signals EC1 to EC4, the selected addressing signals EC1 to EC4 are outputted to the input/output circuit 9 as the output data Dout1 to Dour4. The input/output circuit 9 amplifies these data and outputs the amplified data as the data output to the outside.

In the above-mentioned operation, it is possible to test whether the address latch circuit 4 and the block decoder 3 (which relate to the block erasure operation) both function normally, without executing the actual block erasure operation.

For doing this, first a pin corresponding to the address A0 of the addresses A0 to An is set to the "L" level, and the addresses A1 and A2 representative of a predetermined block address are inputted from the outside. After that, the command data "C" indicative of the block decoder test is inputted from the outside, and further the external CE signal of the "L" level is inputted for a predetermined period. As a result, the chip inside is set to the test mode, so that the block select signals EA1 to EA4 of the block select signals EA1 to EA8 (the output signals of the block decoder 3) are outputted from the input/output circuit 9 through three circuits of the data latch circuit 70, the addressing circuit 71 and the output data switch circuit 72. Therefore, it is possible to check whether the address latch circuit 4 and the block decoder 3 are both operating normally by comparing the contents of the addresses A1 and A2 with those of the input/output circuit 9, respectively.

Secondly, a pin corresponding to the address A0 of the addresses A0 to An is set to the "H" level, and the addresses A1 and A2 representative of a predetermined block address are inputted from the outside. After that, the command data "C" indicative of the block decoder test is inputted from the outside, and further the external CE signal of the "L" level is inputted for a predetermined period. As a result, the chip inside is set to the test mode, so that the block select lines EA5 to EA8 of the block select signals EA1 to EA8 (the output signals of the block decoder 3) are outputted from the input/output circuit 9 through three circuits of the data latch circuit 70, the addressing circuit 71 and the output data switch circuit 72. Therefore, it is possible to check whether the address latch circuit 4 and the block decoder 3 are both operating normally by comparing the contents of the addresses A1 and A2 with those of the input/output circuit 9, respectively.

When the above-mentioned operation is executed by advancing the addresses A0 to A2 in sequence, it is possible to check the operation of the address latch circuit 4 and the block decoder 3 without executing the actual block erasure operation. On the other hand, since the operation of cell source voltage supply circuit 2 and the erasure operation of the cell array 1 can be both tested in the chip erasure test, as far as the address latch circuit 4 and the block decoder 3 both operate normally, the block erasure operation can be executed normally. Further, the operation of the automatic erase control circuit 13, the command input circuit 12, the verify circuit 11 and the counter circuit 10 (all related to the block erasure operation) can be confirmed in all the modes, as far as the test can be made for at least one block. Therefore, it is unnecessary to execute the block erasure test for all the blocks.

FIG. 6 shows the comparison result in the device test between the conventional memory device and the invention memory device, in which (a) denotes the conventional memory device test and (b) denotes the invention memory device test.

As shown by (a) in FIG. 6, in the conventional device test, after the test starts, the automatic all bit erase test was made for about 3 sec; the test pattern write test was made for about 10 ms; and the automatic block erase test was made for about 10 sec, so that 23 sec was required in total.

In contrast with this, as shown by (b) in FIG. 6, in the invention device test, after the test starts, the automatic all bit erase test is made for about 3 sec; and the block decoder test is made for about 10 microseconds to complete all the tests, so that the test time can be reduced down to about 3 sec in total (i.e., ⅛ of the conventional test time), thus reducing the test time markedly.

In this connection, the conventional memory device used for comparison shown in FIG. 6 is a mere example. Therefore, when the capacity of the memory device increases, the difference in the test time between the two further increases.

Figure 7:
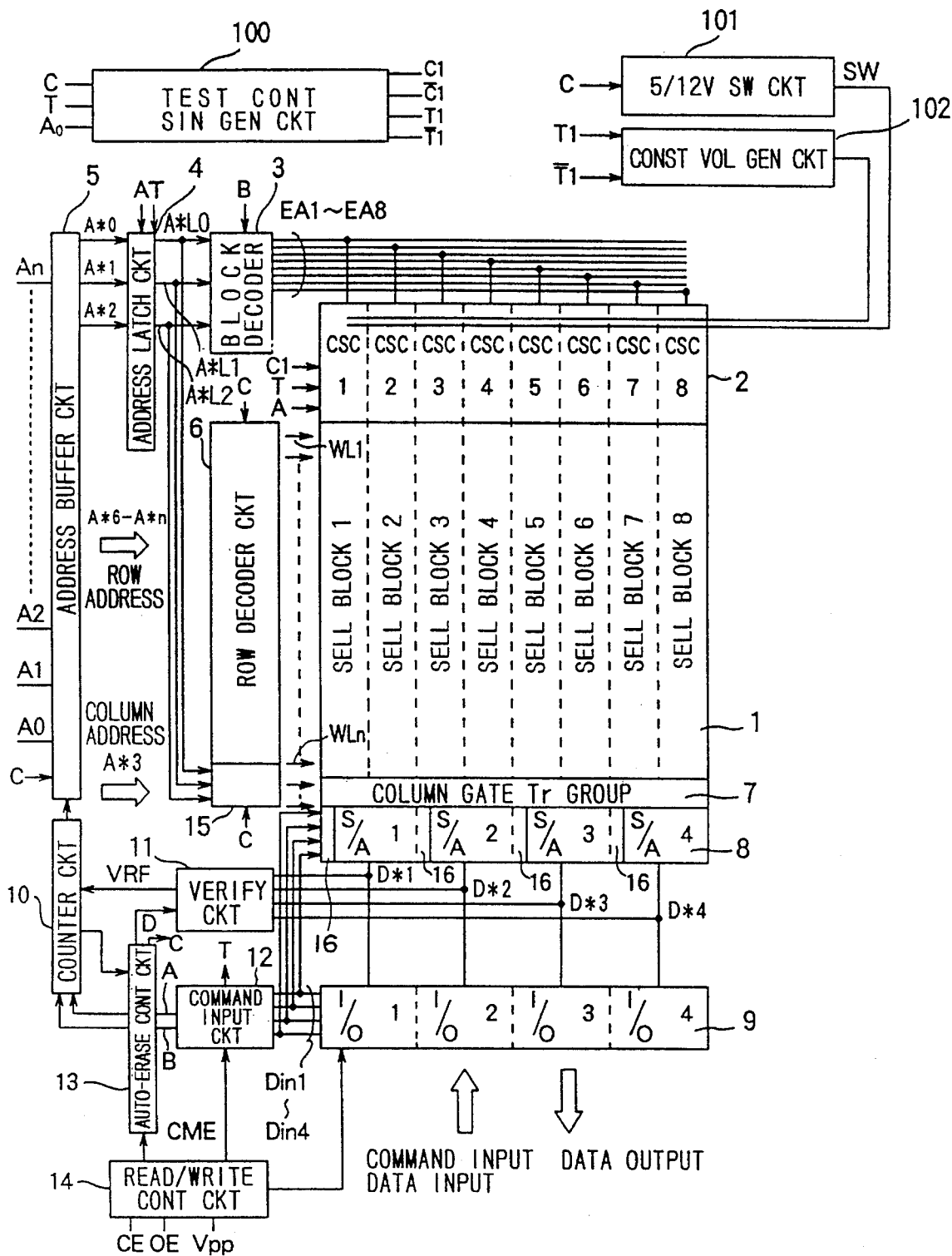
FIG. 7 is a block diagram showing a second embodiment of the non-volatile semiconductor memory device according to the present invention.

FIG. 7 is a block diagram showing a second embodiment of the non-volatile semiconductor memory device according to the present invention. As shown in FIG. 7, a test control signal generating circuit 100 inputs the internal signals C and T and the address A0, and outputs a test control signal C1, an inversion signal/C1 of the test control signal C1, a test control signal T1 and an inversion signal/T1 of the test control signal T1. A 5/12 V switch circuit 101 selects any of 5 V and 12 V on the basis of the internal signal C, and gives the selected voltage to the cell source voltage supply circuit 2 as the voltage signal SW. A constant voltage generating circuit 102 inputs the test control signal T1 and the test control signal/T1 to generate a constant voltage of 2 V, and outputs the constant voltage to the cell source voltage supplying circuit 2. The points different in construction between the first embodiment shown in FIG. 1 and the second embodiment shown in FIG. 7 are that the test control signal generating circuit 100, the 5/12 V switch circuit 101 and the constant voltage generating circuit 102 are additionally provided and further the address latch circuit 4, the cell source voltage supplying circuit 2 and the command input circuit 12 are different in construction, while the data latch circuit 70, the addressing circuit 71 and the output data switch circuit 72 are removed.

Figure 8:
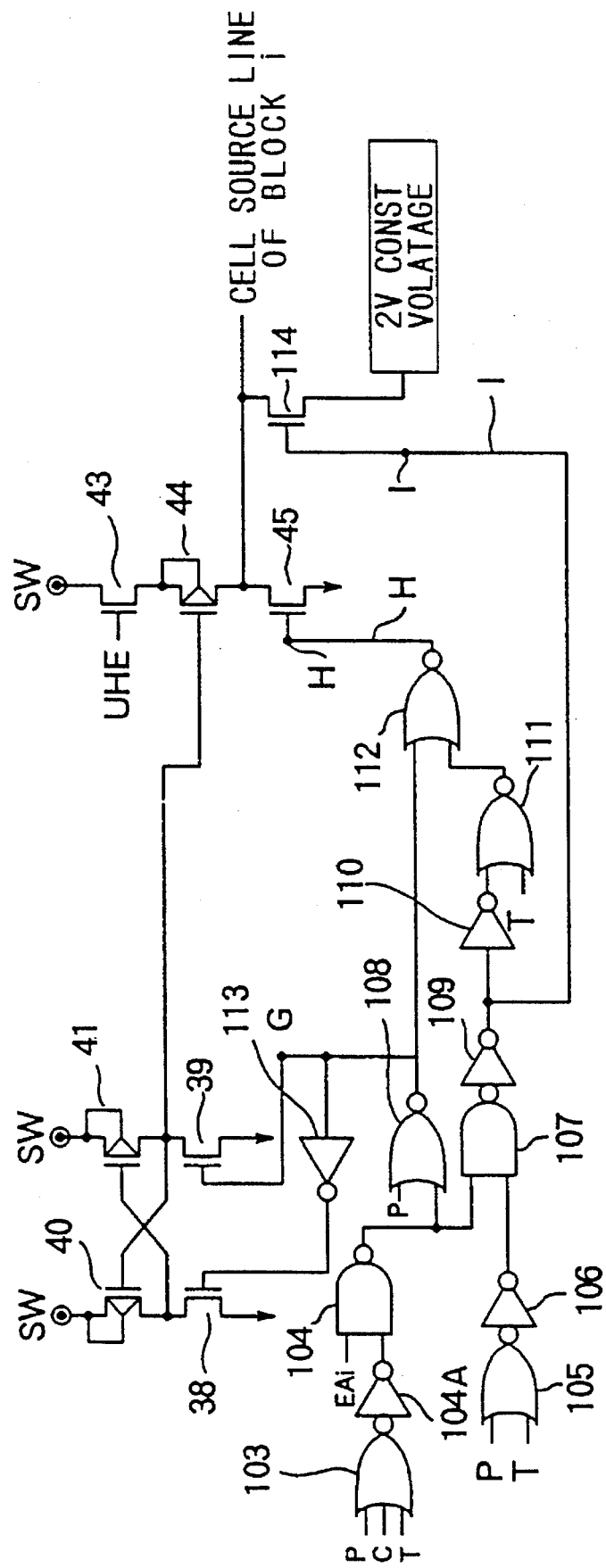
FIG. 8 is a circuit diagram showing a cell source voltage supply circuit shown in FIG. 7.
Figure 25:
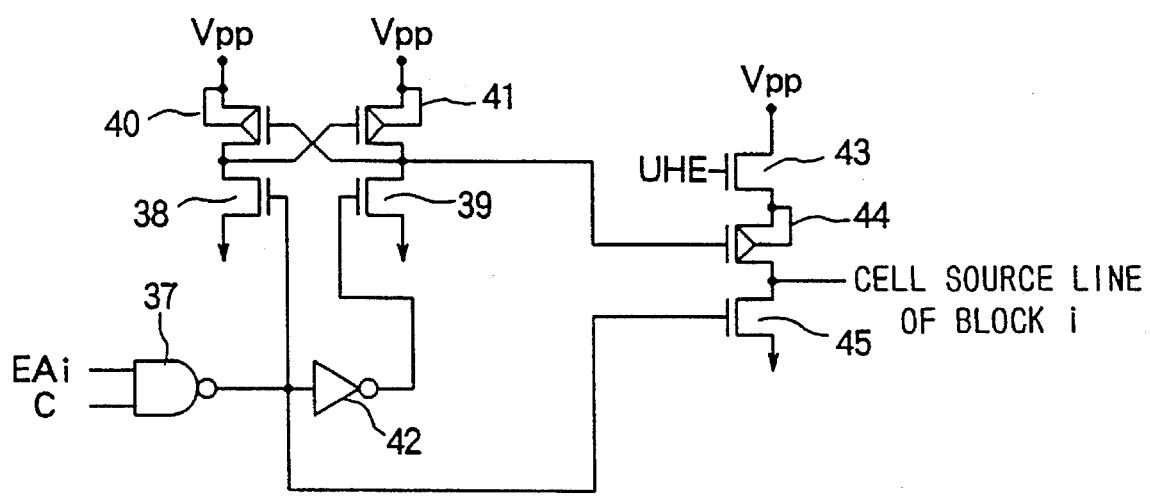
FIG. 25 is a circuit diagram showing a cell source voltage supply circuit for one block shown in FIG. 20.
Figure 26A:
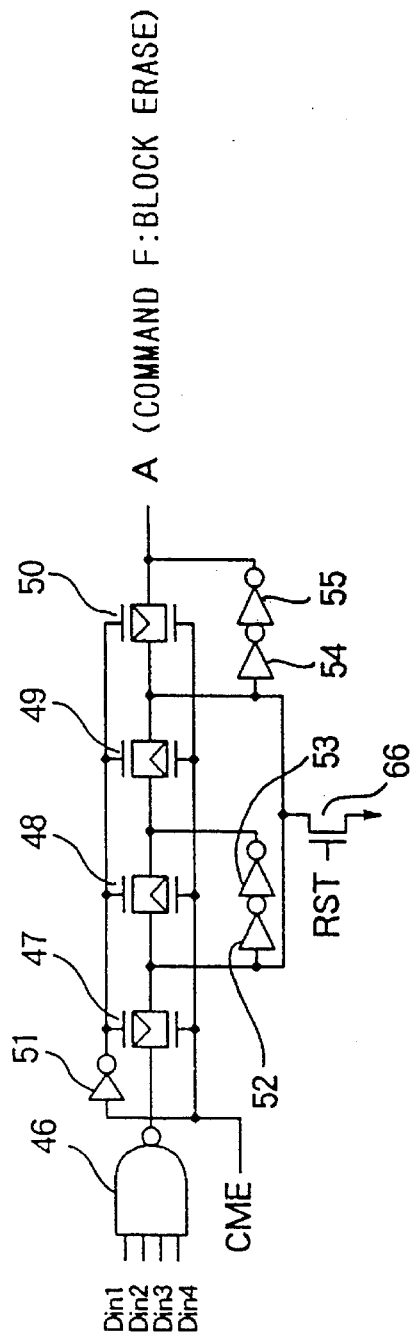
FIGS. 26A and 26B are circuit diagrams showing a command input circuit shown in FIG. 20.
Figure 26B:
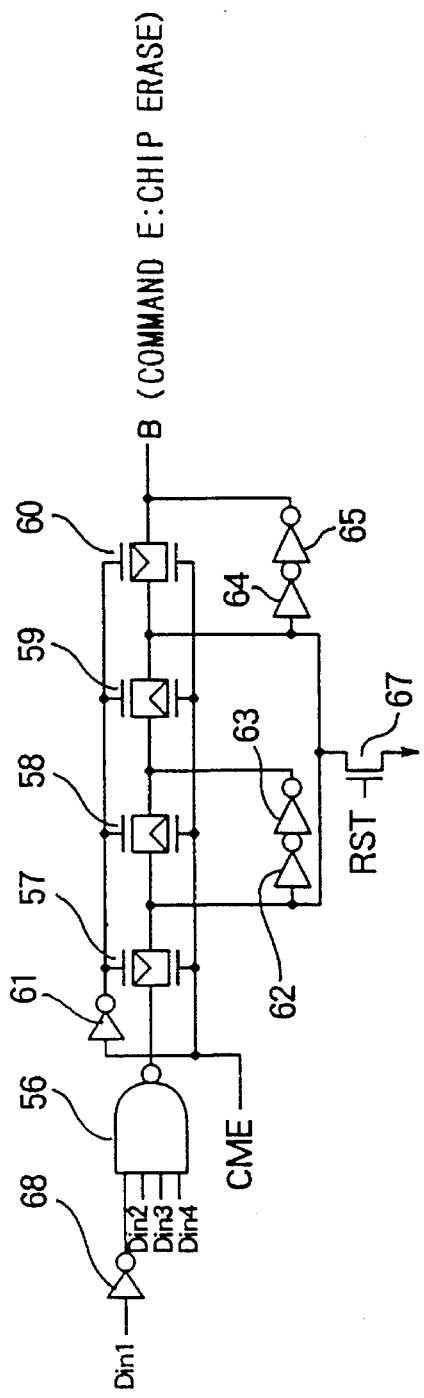
Figure 27:
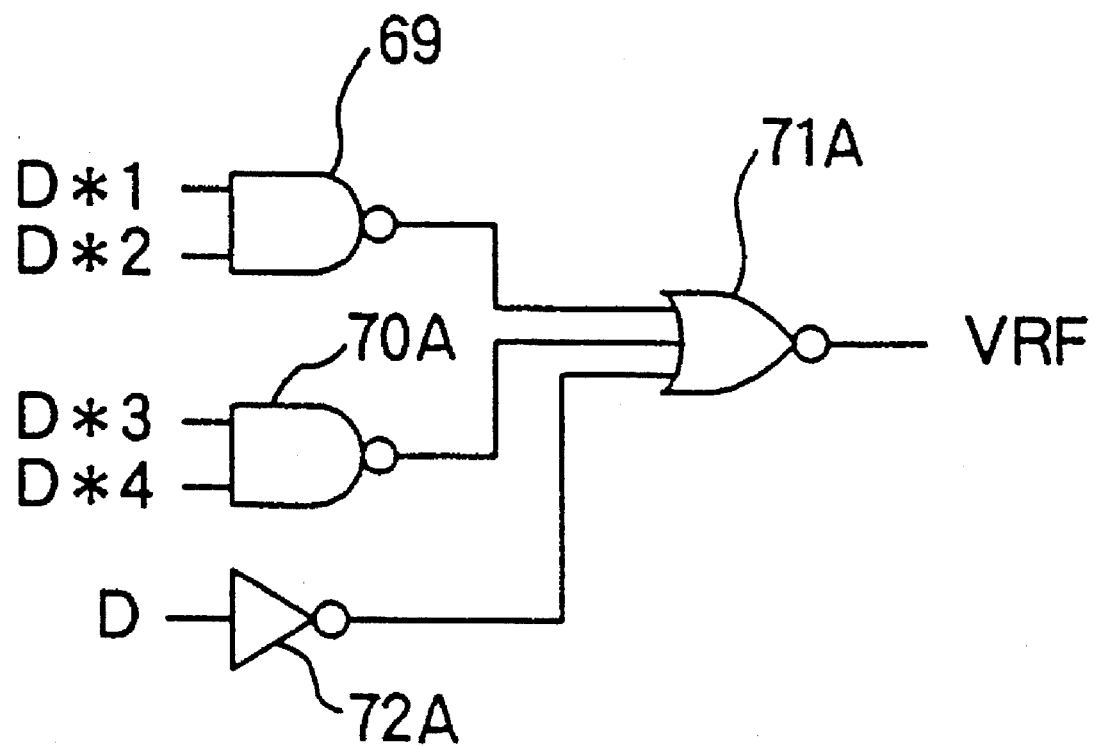
FIG. 27 is a circuit diagram showing a verify circuit shown in FIG. 20.
Figure 28:
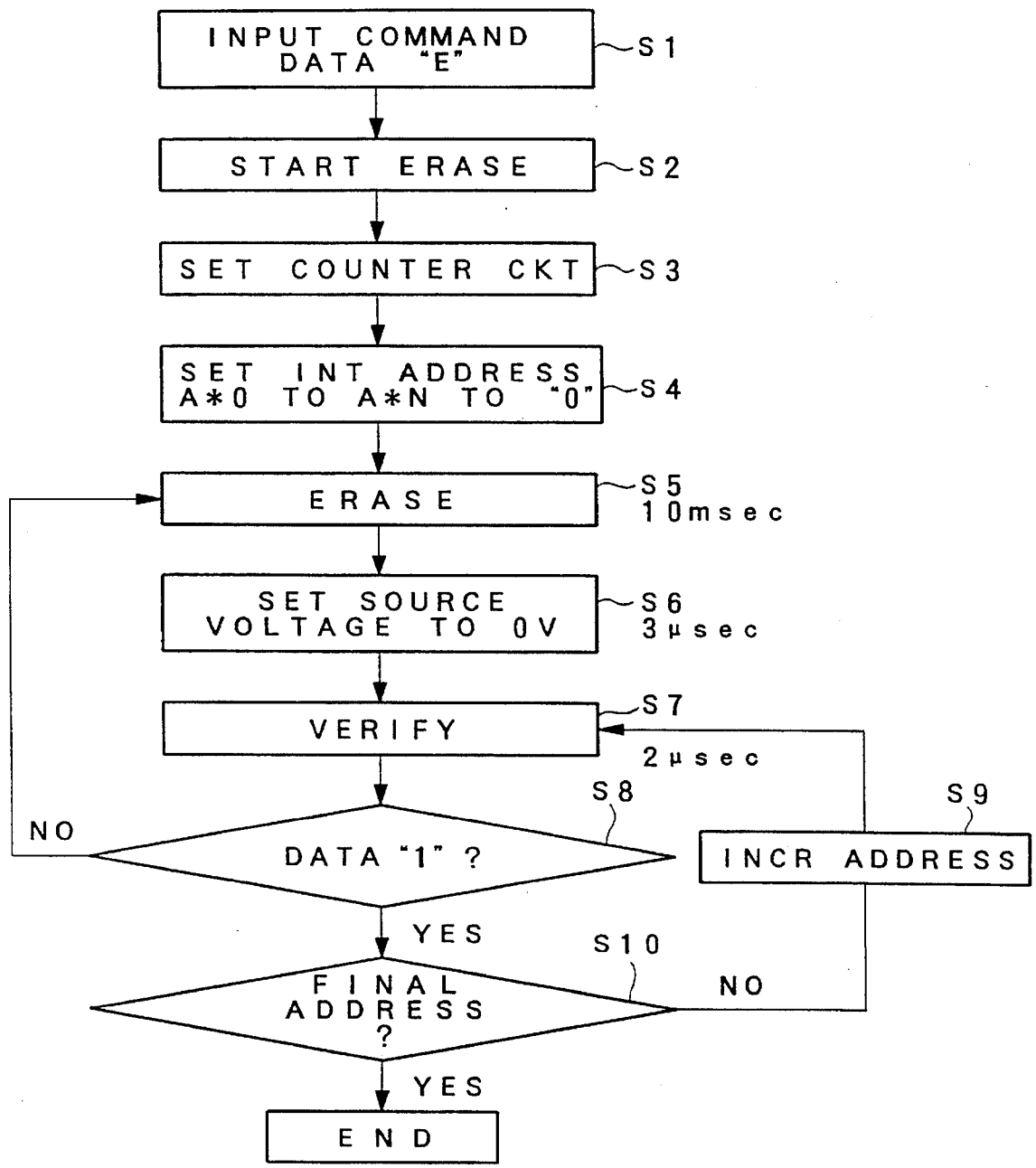
FIG. 28 is a flowchart for assistance in explaining the operation of the chip erasure mode.
Figure 29:
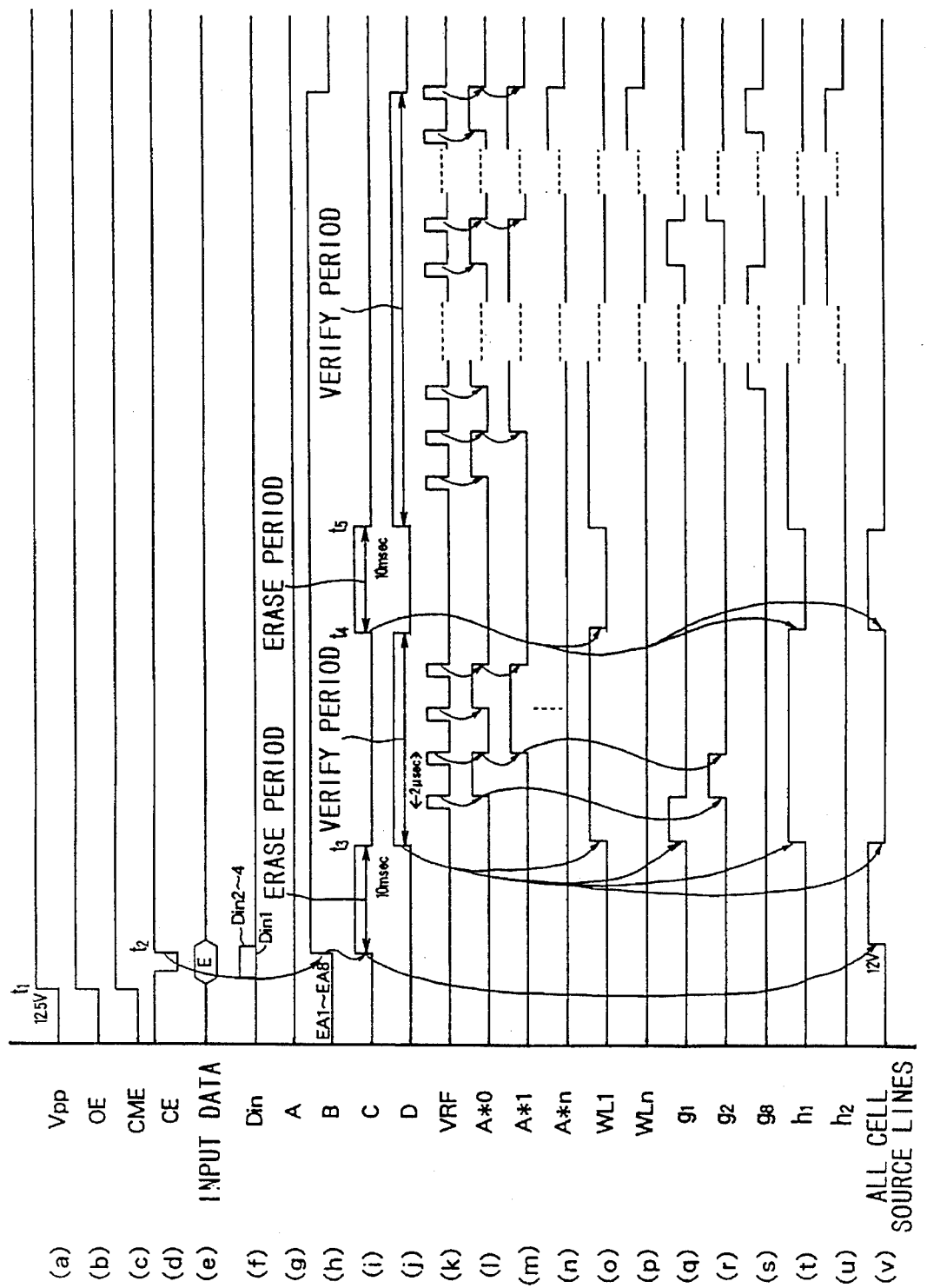
FIG. 29 is a timing chart for assistance in explaining the operation of the chip erasure mode.
Figure 30:
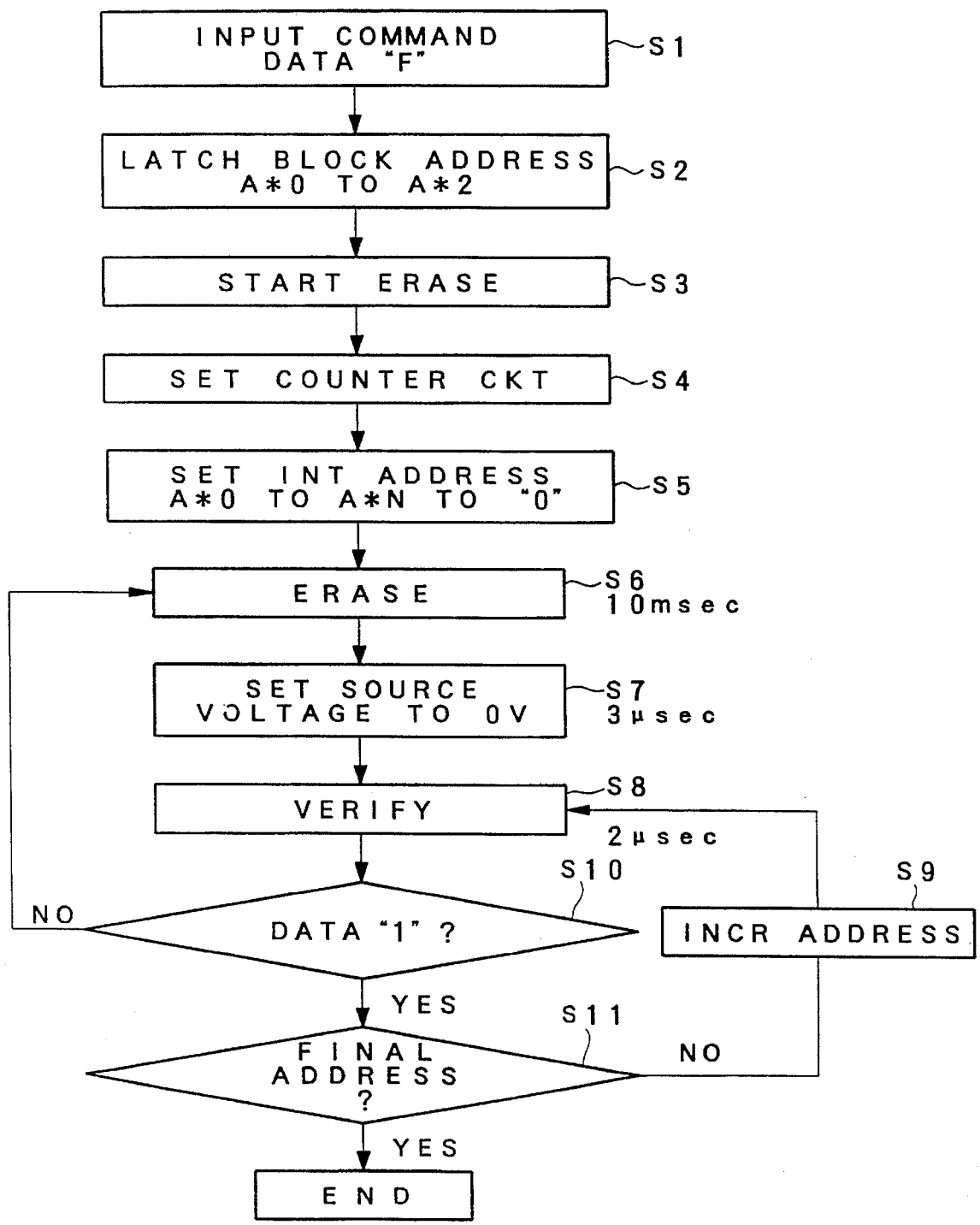
FIG. 30 is a flowchart for assistance in explaining the operation of the block erasure mode.
Figure 31:
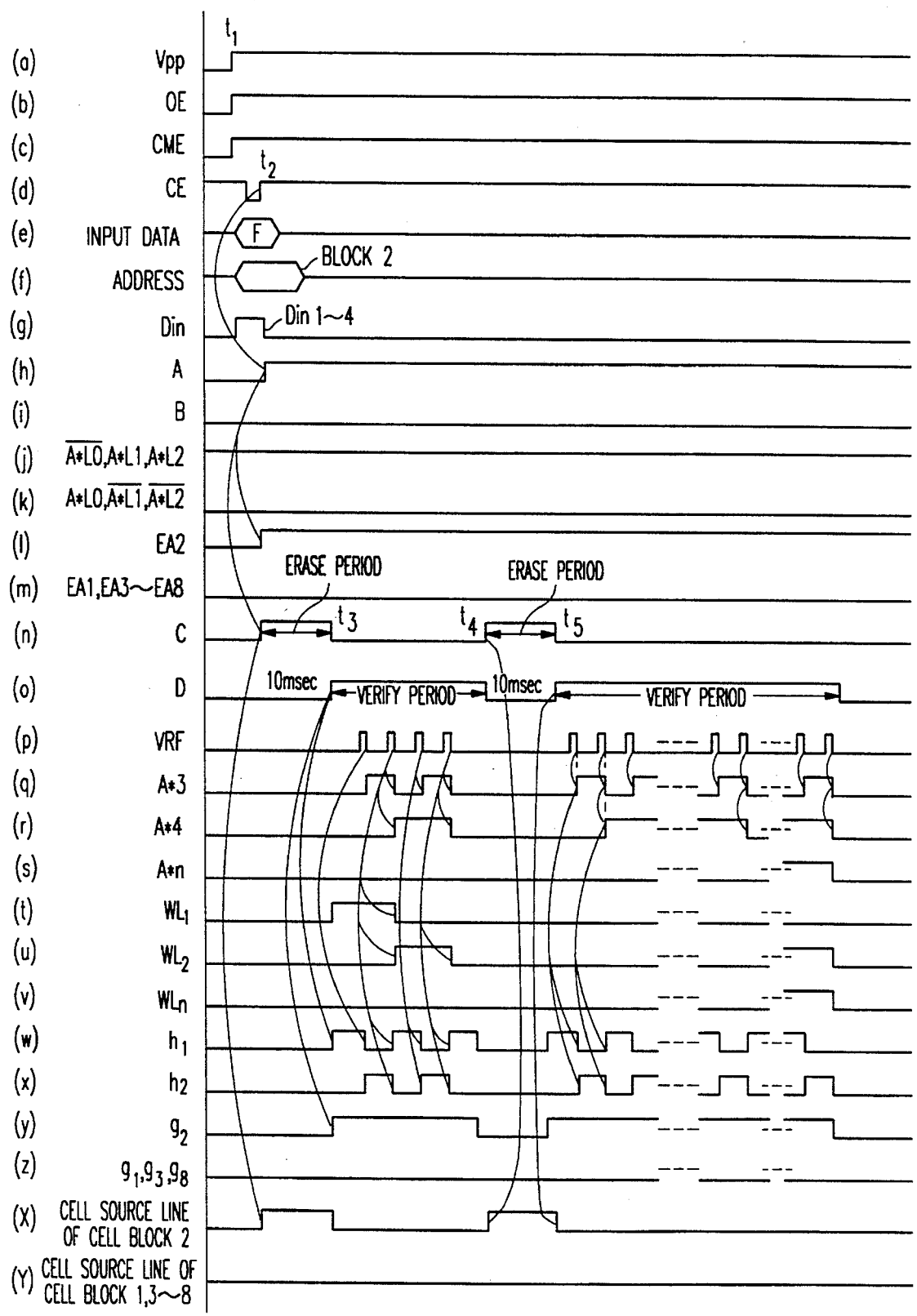
FIG. 31 is a timing chart for assistance in explaining the operation of the block erasure mode.

FIG. 8 is a circuit diagram showing the cell source voltage supplying circuit 2 shown in FIG. 7, in which only one of the cell source voltage supply blocks CSC1 to CSC8 for constituting the cell source voltage supply circuit 2 is shown. In FIG. 8, the internal signals C and T and the internal signal P for instructing data write are inputted to a NOR gate 103. The output of the NOR gate 103 is inverted by an inverter 104A, and then inputted to a NAND gate 104 together with the block select signal EAi (EA1 to EA8). On the other hand, the internal signals T and P are inputted to a NOR gate 105. The output of the NOR gate 105 is inputted to a NAND gate 107 via an inverter 106, together with the output of the NAND gate 104. On the other hand, the internal signal P is inputted to a NOR gate 108 to which the output of the NAND gate 104 is connected. The output of the NAND gate 107 is inverted by an inverter 109. The output of the inverter 109 is inverted by an inverter 110, and then inputted to a NOR gate 111 together with the internal signal T. The respective outputs of the NOR gates 108 and 111 are given to a NOR gate 112. On the other hand, the output of the NOR gate 108 is inverted by an inverter 113. The output of the inverter 113 is inputted to the gate of a transistor 38. The output of the NOR gate 112 is inputted to the gate of a transistor 45. The output of the inverter 109 is inputted to the gate of a transistor 114. Further, the drain of the transistor 114 is connected to the cell source line of the cell block i, and the source thereof is connected to a constant voltage of 2 V. The connections other than the above are the same as the conventional source voltage supply circuit as shown in FIG. 25, except that a voltage signal SW applied by the 5/12 V switch circuit 101 is applied to the respective sources of the transistors 40 and 41 and to the drain of the transistor 43, instead of the external voltage Vpp.

Further, in FIG. 8, the gate of the transistor 39 is denoted as a node G; the gate of the transistor 45 is denoted as a node H; and the gate of the transistor 114 is denoted as a node I, respectively.

The operation of the circuit shown in FIG. 8 will be described hereinbelow with reference to a table shown in FIG. 9. In FIG. 9, "mode" is divided into four modes as the erasure mode (when the command data "C" is "H"), the write mode (when the internal signal P is "H", the read mode, and the block test mode (when the internals signal T is "H"). Further, "select" and "non-select" indicate whether the cell source voltage supply blocks CSC1 to CSC8 are selected or not. The statuses (levels) at the respective nodes G, H and I are shown by "1" ("H") or "0" ("L"), and the source line potential is also shown for each case.

Now, when the internal signal C is at the "H" level; that is, the mode is the erasure mode, if the cell source voltage supply block CSC1 to CSC8 is selected, the node G is at the "H" level and the nodes H and I are at the "L" level. In this case, the cell source line voltage is 12 V. On the other hand, when the cell source voltage supply block CSC1 to CSC8 is not selected, the nodes G and I are at the "L" level and the node H is at the "H" level. The cell source line voltage is 0 V.

On the other hand, when the internal signal P is at the "H" level; that is, the mode is the write model if the cell source voltage supply block CSC1 to CSC8 is selected, the nodes G and H are at the "L" level and the node H is at the "H" level. In this case, the cell source line voltage is 0 V. On the other hand, when the cell source voltage supply block CSC1 to CSC8 is not selected, the nodes G and H are at the "L" level and the node I is at the "H" level. The cell source line voltage is 2 V.

Further, in the read mode, irrespective of whether the cell source voltage supply block CSC1 to CSC8 is selected or not, the nodes G and I are at the "L" level and the node H is at the "H" level, so that the cell source voltage is 0 V.

Further, when the internal signal T is at the "H" level; that is, the mode is the block test mode, if the cell source voltage supply block CSC1 to CSC8 is selected, the node G is at the "H" level and the nodes H and I are at the "L" level. In this case, the cell source line voltage is 3 V (5 to 2 V). On the other hand, when the cell source voltage supply block CSC1 to CSC8 is not selected, the node G is at the "L" level and the nodes H and I are at the "H" level. The cell source line voltage is 2 or 0 V.

Figure 10:
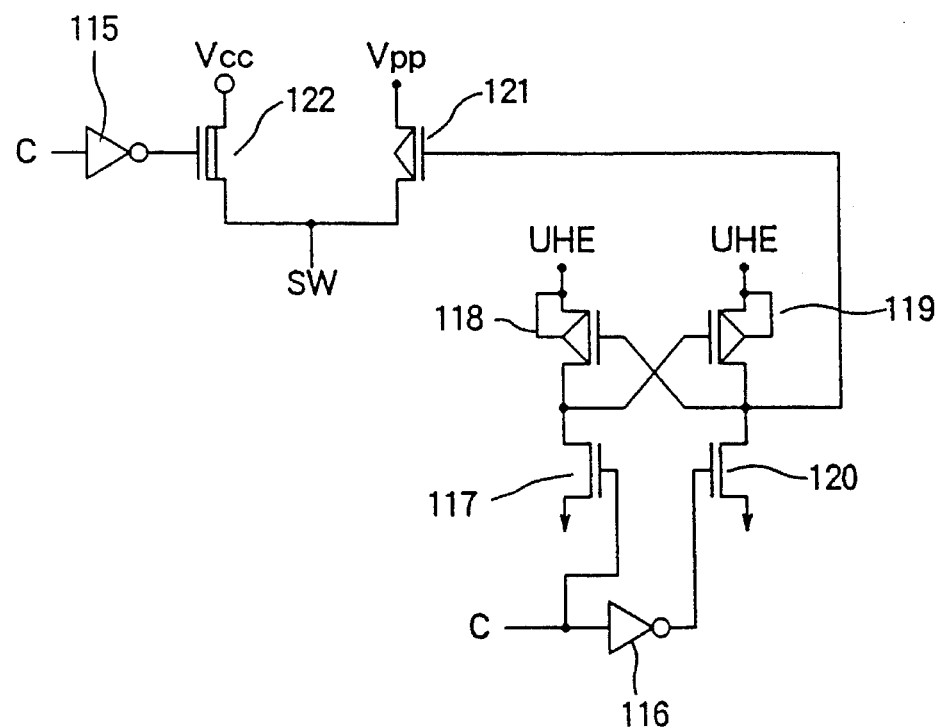
FIG. 10 is a circuit diagram showing a 5 V/12 V switch circuit shown in FIG. 7.

FIG. 10 is a circuit diagram showing the 5/12 V switch circuit 101 for generating the voltage signal SW. In FIG. 10, the internal signal C is inputted to inverters 115 and 116 and the gate of a transistor 117. The source of the transistor 117 is grounded and the drain thereof is connected to the drain of a transistor 118 and the gate of a transistor 119. The output of the inverter 116 is connected to the gate of a transistor 120. The source of the transistor 120 is grounded and the drain thereof is connected to the gate of a transistor 118 and the drain of the transistor 119. The sources of the transistors 118 and 119 are connected to a supply voltage UHE. The gate of the transistor 118 and the drains of the transistors 119 and 120 are connected to the gate of the transistor 121. The output of the inverter 115 is connected to the gate of a transistor 122. The source of the transistor 121 is connected to the external voltage Vpp (12 V), and the source of the transistor 121 is connected to the external voltage Vpp (12 V). Further, the drains of the two transistors 121 and 122 output the voltage signal SW.

In the circuit construction as described above, when the internal signal C is at the "H" level, the transistor 122 is turned on, so that the supply voltage Vcc is outputted as the voltage signal SW. In this case, the transistors 117 and 119 are turned on, and the transistors 118 and 120 are turned off, so that the voltage UHE is applied to the gate of the transistor 121 to turn off the transistor 121.

On the other hand, when the internal signal C is at the "L" level, the transistor 122 is turned off. In this case, the transistors 117 and 119 are turned off and the transistors 118 and 120 are turned on, so that the gate of the transistor 121 is at the "L" level. That is, the transistor 121 is turned on. As a result, the external voltage Vpp is outputted as the voltage signal SW.

In other words, the 5/12 V switch circuit 101 outputs the external voltage Vpp in the erasure mode of the cell array 1, and the supply voltage Vcc in the modes other than the erasure mode.

Here, in FIG. 10, the voltage UHE is an output signal of a booster circuit (not shown) which can supply 15 V ("H" level) in erasure mode, and Vcc ("H" level) in the modes other than the erasure mode.

Figure 11:
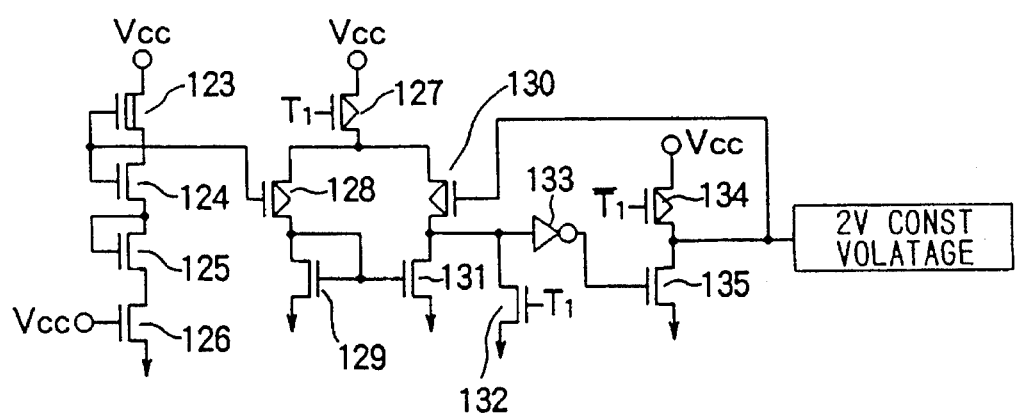
FIG. 11 is a circuit diagram showing a constant voltage generating circuit shown in FIG. 7.

FIG. 11 is a circuit diagram showing the constant voltage generating circuit shown in FIG. 7. In FIG. 11, transistors 123 to 126 are connected in series between the supply voltage Vcc and the ground voltage. The source of the transistor 123 and the gate of the transistor 126 are connected to the supply voltage Vcc. The gate of the transistor 125 is connected to the drain thereof. The gates of the transistors 123 and 124 are connected to the gate a transistor 128. A test signal T1 is inputted to the gate of a transistor 127. The source of the transistor 127 is connected to the supply voltage Vcc, and the drain thereof is connected to the sources of the transistors 128 and 130. The drain of the transistor 128 is connected to the drain and gate of the transistor 129. The source of the transistor 129 is grounded. The drain of the transistor 130 is connected to the drains of transistors 131 and 132 and an inverter 133. The source of the transistor 131 is grounded. Further, the test control signal T1 is inputted to the gate of the transistor 132. The source of the transistor 132 is grounded. The output of the inverter 133 is connected to the gate of the transistor 135. The source of the transistor 135 is grounded. The test control signal/T1 is inputted to the gate of a transistor 134. The drain of the transistor 135 is connected to the drain of the transistor 134 and the gate of the transistor 130. Further, 2 V voltage can be outputted from the drains of the transistors 134 and 135.

In the circuit construction as described above, when the test control signal T1 is at the "L" level, the voltage of 2 V is not outputted from the output terminal thereof. On the other hand, when the test control signal T1 is at the "H" level, a constant voltage of 2 V can be outputted from the output terminal thereof. This is because a constant voltage is generated through a voltage division circuit composed of transistors 123 to 126, and then transmitted to the output terminal thereof through a differential circuit composed of the transistors 128 to 130.

Further, the reason why 2 V is supplied from the constant voltage generating circuit 102 to the cell source lines of non-selected blocks in the write mode is to prevent data from being erroneously written in the memory cells of the non-erased block. This is because when data are written in the erased block, the gate voltage of the memory cells of the non-erased block is also set to 12 V.

Figure 12:
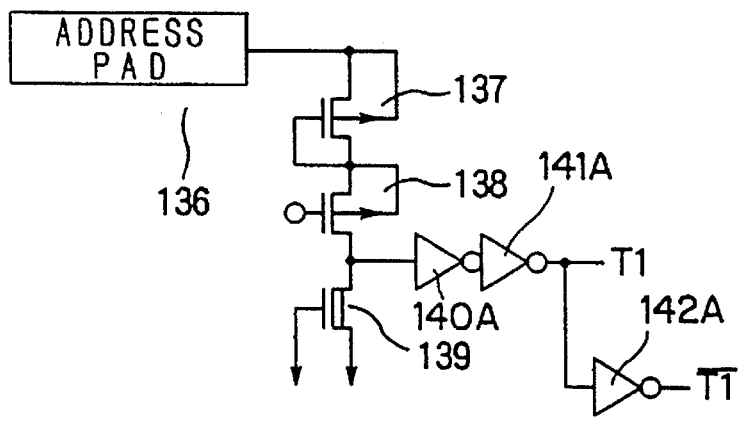
FIG. 12 is a circuit diagram showing a test signal generating circuit shown in FIG. 7.

FIG. 12 is a circuit diagram showing the test control signal generating circuit shown in FIG. 7, in which the circuit construction for generating the test control signal T1 and the test control signal/T1 are shown in particular. An address pad (pin) 136 for inputting an address other than the block address is connected to a serial circuit of transistors 137 to 139. The junction point between the two transistors 138 and 139 outputs the test control signal T1 through a serial circuit of two inverters 140A and 141A. The test signal T1 is inverted by an inverter 142A, and then outputted as the test control signal/T1.

In the circuit construction as described above, when a high test voltage of 12 V is applied to the address pad 136, this voltage can be detected and the test control signal T1 changes to the "H" level.

Figure 13:
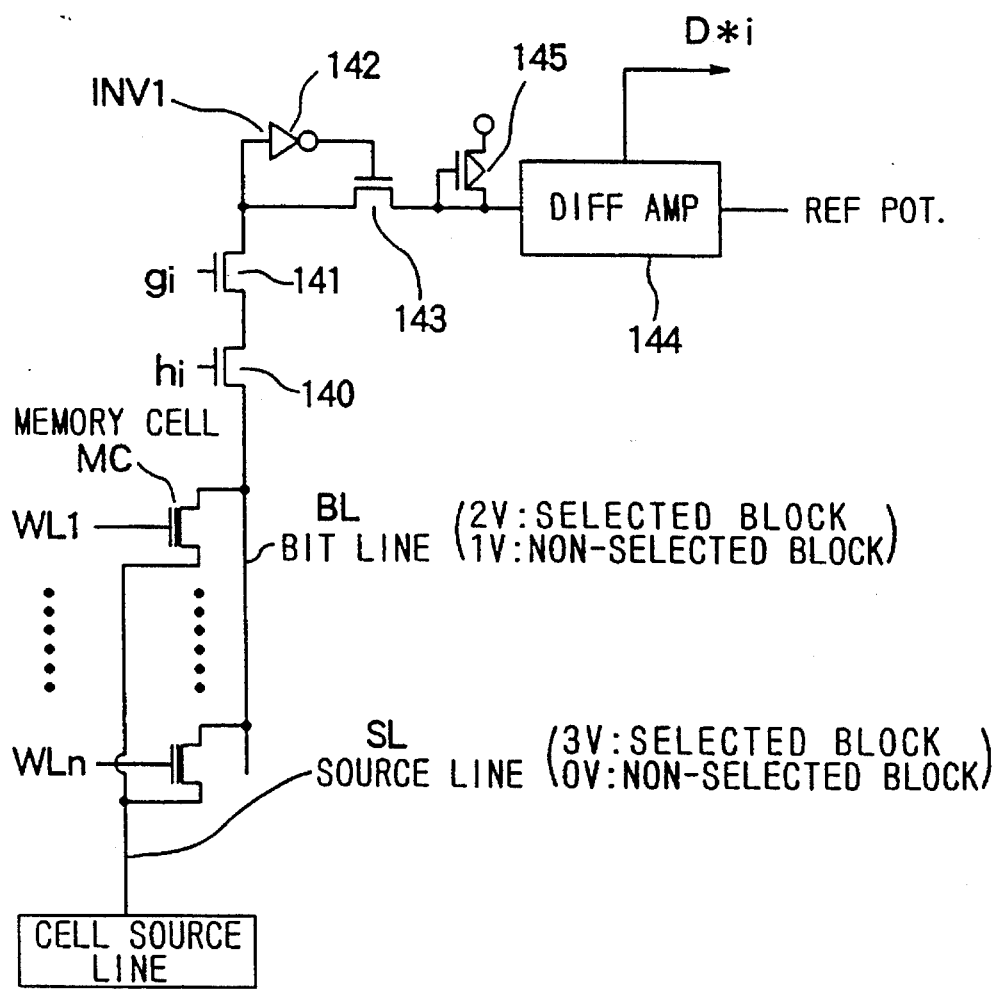
FIG. 13 is a circuit diagram showing one block of the sense amplifiers shown in FIG. 7.

FIG. 13 is a circuit diagram showing only one block of the sense amplifier blocks S/A1 to S/A4 of the sense amplifier 8. In FIG. 13, the sources of the memory cell transistors MC (to each gate of which each of the word select lines WL1 to WLn is connected) are connected to the cell source line in unit of block. On the other hand, the drains of the memory cell transistors MC are connected in common to the bit line BL. The bit line is connected to the source of a transistor 143 via two transistors 140 and 141. An output of an inverter 142 is inputted to the gate of the transistor 143. The column decode signal g1 is inputted to the gate of the transistor 141, and the column decode signal hi is inputted to the gate of the transistor 140. The drain of the transistor 143 is inputted to a differential amplifier 144. Further, the drain of the transistor 143 is connected to the gate and drain of a transistor 145 (to the source of which the supply voltage is supplied). A reference potential is applied to the differential amplifier 144, and the data on the sensed bit line is derived as the internal data D*i and then outputted to the input/output circuit 9 shown in FIG. 7.

In the circuit construction as described above, a voltage of 3 V is applied to the cell source line of the selected block, and 0 V is applied to the cell source lines of the non-selected blocks. On the other hand, a voltage of 2 V is applied to the bit lines of the selected block, and 1 V is applied to the bit lines of the non-selected blocks.

Figure 14:
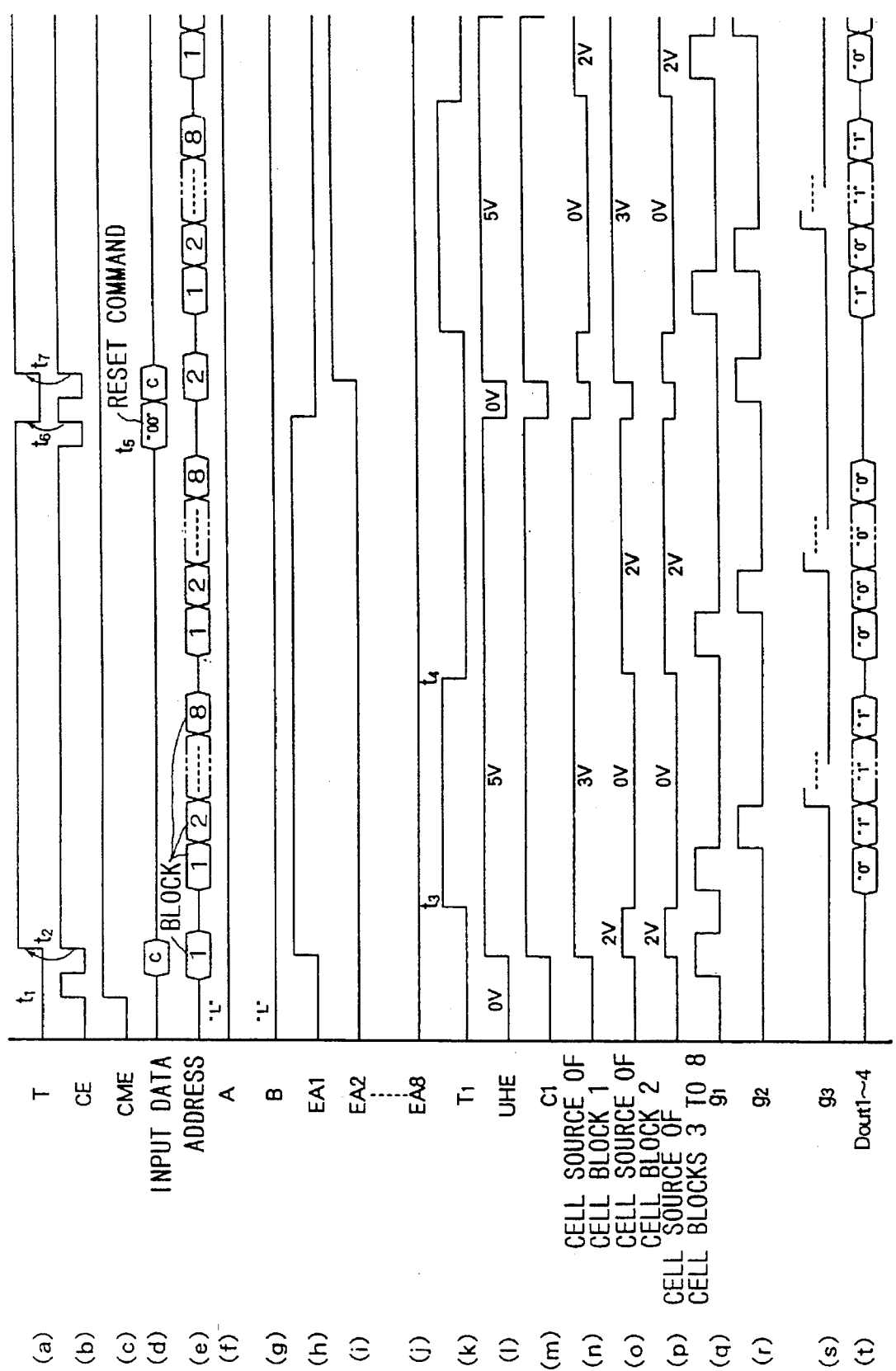
FIG. 14 is a timing chart for assistance in explaining the operation of the device shown in FIG. 7.

The operation of the semiconductor memory device constructed as described above will be described hereinbelow with reference to a timing chart shown in FIG. 14. In FIG. 14, (a) denotes the internal signal T; (b) denotes the external CE signal; (c) denotes the control signal CME; (d) denotes the input data; (e) denotes the addresses; (f) denotes the internal signal A; (g) denotes the internal signal B; (h) denotes the block select signal EA1; (i) denotes the block select signal EA2; (j) denotes the block select signal EA8; (k) denotes the test control signal T1; (l) denotes the voltage UHE; (m) denotes the test control signal C1; (n) denotes the cell source line of the cell block 1; (o) denotes the cell source line of the cell block 2; (p) denotes the cell source line of the cell blocks 3 to 8; (q) denotes the column decode signal g1; (r) denotes the column decode signal g2; (s) denotes the column decode signal g3; and (t) denotes the read data, respectively.

Now, in the test mode, at time t1, as shown by (b) in FIG. 14, the external CE signal changes to the "H" level, so that the read/write control circuit 14 outputs the control signal CME as shown by (c).

Then, data representative of the command data "C" as shown by (d) are given from the input/output circuit 9, and the addresses for selecting the cell block 1 as shown by (e) is given as the address A0 to An.

As a result, the column decode signals g1, g2 and g3 as shown by (q), (r) and (s) are given to the cell array 1.

At time t2, when the external CE signal rises, the corresponding block addresses of the address A0 to An are latched by the address latch circuit 4, so that the block select signals EA1 to EA8 are determined as shown by (h), (i) and (j). At the same time, the internal signal T as shown by (a) is outputted by the command input circuit 12. Further, the test control signal C1 outputted by the test control signal generating circuit 100 rises to the "H" level as shown by (m), and the voltage UHE as shown by (l) rises to 5 V.

As a result, 3 V is outputted to the cell source line of the cell block 1 as shown by (n), and the 2 V is outputted to the cell source lines of the other remaining cell blocks 2 to 8 as shown by (o) and (p).

Successively, at time t3, a high voltage of 12 V is supplied to an address pin other than the block address pins. As a result, the test control signal T1 of the test control signal generating circuit 100 rises to the "H" level as shown by (k). Then, as shown by (n), a voltage of 3 V (which is lower than the voltage signal SW of 5 V for test by a threshold value of the N-channel transistor) is applied to the cell source line of the selected cell block 1. At this time, since the test control signal T1 is at the "H" level, the output of the constant voltage generating circuit 102 is 0 V, so that 0 V is supplied to the cell source lines of the non-selected cell blocks 2 to 8, as shown by (o) and (p).

Under the conditions as described above, when the read operation starts, as shown in FIG. 13, the voltage of the bit lines of the selected cell block rises up to about 2 V via the memory cells. On the other hand, the threshold value of the inverter 142 shown in FIG. 13 is determined so that the bit line potential can be set to about 1.2 V when the memory cells are turned off but to about 1.0 V when turned on. Therefore, when the selected block to be erased is selected and read, the data "1" of when the memory cell is turned on is outputted through the input/output circuit 9. In other words, under the condition that the test control signal T1 is at the "H" level, when the cell blocks 1 to 8 are read in sequence by incrementing the block address as shown by (t) in FIG. 14, it is possible to check whether the selected block is being decoded normally and whether the voltage is supplied from the 5/12 V switch circuit 101 to the source lines normally.

Next, at time t4, when the voltage of the address pad 136 for inputting a predetermined address is lowered from 12 V to 5 V, the test control signal T1 changes to the "L" level as shown by (k), so that the output voltage of the constant voltage generating circuit 102 is lowered to 2 V.

Under these conditions, when the block address is incremented to read the cell blocks 1 to 8 in sequence as shown by (t) in FIG. 14, since the bit lines are kept at 2 V or higher even if any cell block is inputted, "0" data is outputted. As a result, it is possible to check whether the voltage of 2 V can be supplied from the constant voltage generating circuit 102 to the cell source lines normally.

Successively, at time t5, to end the test mode once, the external CE signal is returned to the "L" level as shown by (b) in FIG. 14, and in addition a reset command "00" is inputted as the data input Din1 to Din4 as shown by (d). Further, when the external CE signal is raised at time t6, this command is inputted to the command input circuit 12, so that the internal signal T falls down to the "L" level. Accordingly, the block select signals EA1 to EA8 are reset as shown by (h), (i) and (j). Further, as shown by (l), the voltage UHE drops to 0 V. Further, the test control signal C1 changes to the "L" level as shown by (m), and further all the cell source lines change to 0 V, as shown by (n), (o) and (p).

After the rest command "00", the command data C is inputted again as shown by (d), and in addition an address for selecting the succeeding cell block 2 is inputted. Further, at time t7, when the external CE signal (once set to the "L" level) is raised to the "H" level, the command data "C" and the succeeding block address can be obtained.

After the above-mentioned operation, on the basis of quite the same procedure at and after t2, it is possible to check whether all the cell source voltage supply blocks CSC1 to CSC8 are operating normally and whether the block decoder 3 operates normally, by executing the data read operation while incrementing the block address A0 to A2.

As described above, in the second embodiment, the erasure test can be made in a short time, and in addition it is possible to simultaneously check whether the predetermined bias voltage can be supplied to the non-selected blocks in write operation.

Further, in this second embodiment, since the data latch circuit 70, the addressing circuit 71 and the output data switch circuit 72 are not required being different from the first embodiment, the number of elements can be reduced. That is, since the second embodiment can be realized by adding only the test control signal generating circuit 100, the 5/12 V switch circuit 101 and the constant voltage generating circuit 102, the test can be made effectively at a small chip area, thus reducing the cost required therefor.

Figure 15:
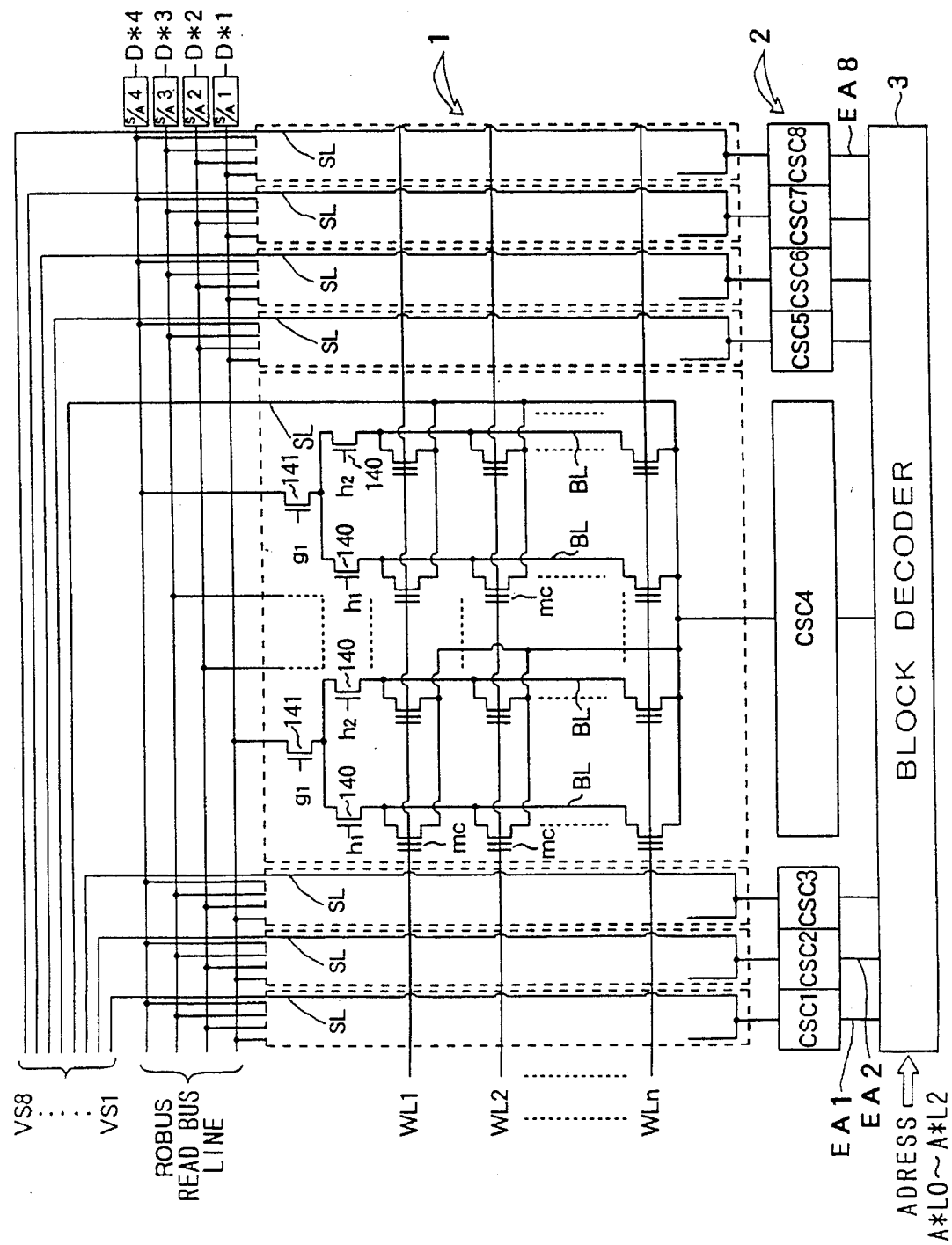
FIG. 15 is a block diagram showing a third embodiment of the non-volatile semiconductor memory device according to the present invention.

FIG. 15 is a block diagram showing a third embodiment of the non-volatile semiconductor memory device according to the present invention. In FIG. 15, the memory cells mc are arranged into a matrix. The word select lines WL1 to WLn are inputted to the gates thereof, respectively. The source lines of the memory cells mc are connected in unit of block and connected to each of the cell source voltage supply blocks CSC1 to CSC8 and each of source potential detecting lines VS1 to VA8, respectively. Further, the drains of the memory cells mc are connected to the bit lines BL respectively, and further connected to read bus lines ROBUS and the sense amplifier blocks S/A1 to S/A4 via two transistors 140 (to the gates of which the column decode signals h1 and h2 are inputted, respectively) and a transistor 141 (to the gate of which the column decode signal g1 is inputted), respectively. The sense amplifier blocks S/A1 to S/A4 sense the status (level) of the selected bit lines to output the internal data D*1 to D*4 to the outside.

Figure 16:
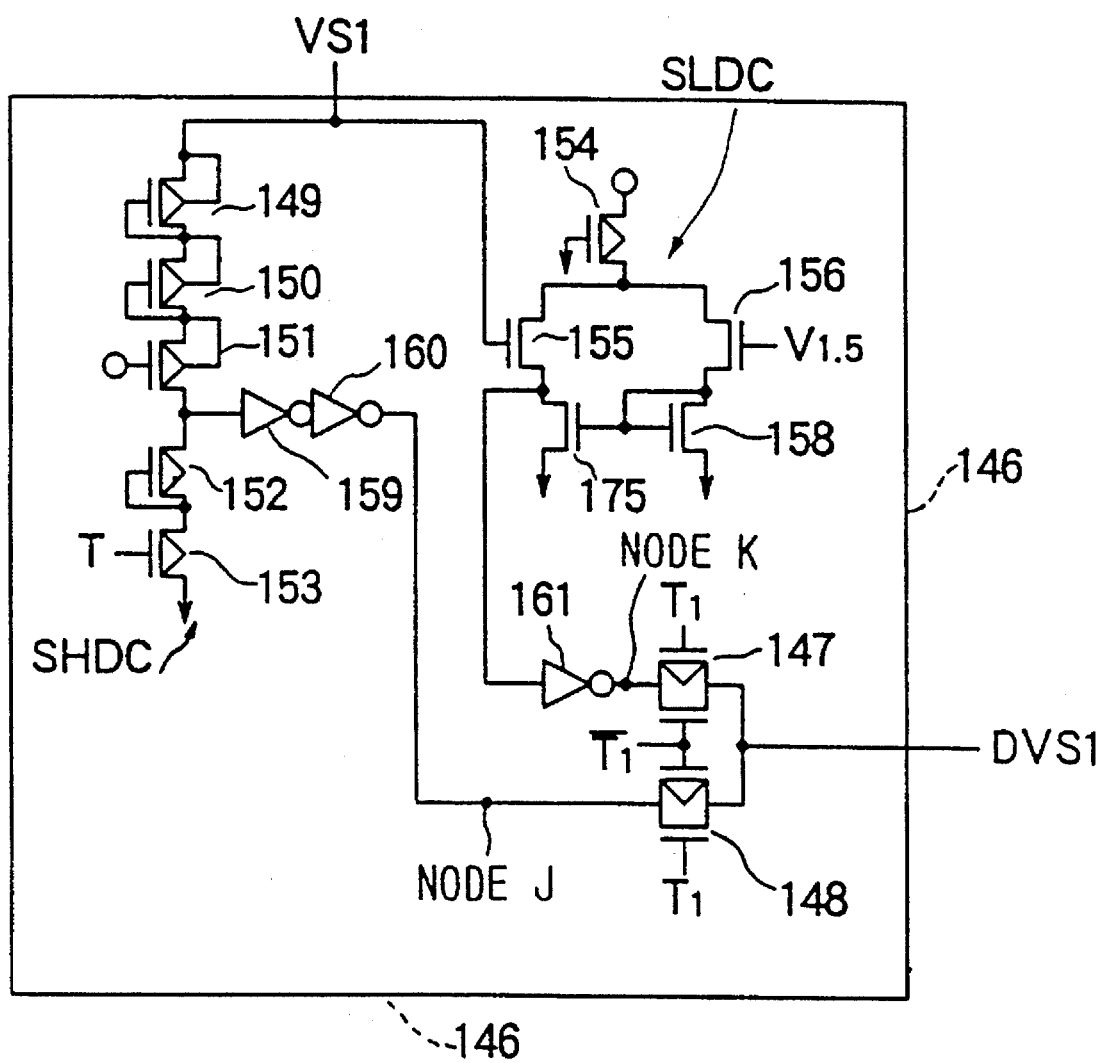
FIG. 16 is a circuit diagram showing a source potential detecting circuit shown in FIG. 15.

In the device construction as shown in FIG. 15, the source potential detecting lines VS1 to VS8 are connected to the source potential detecting circuit 146 as shown in FIG. 16. In the source potential detecting circuit 146, the source potential detection line VS1 to VS8 (e.g., VS1) is connected to a source high potential detecting circuit section SHDC (composed of series-connected transistors 149 to 153) and a source low potential detecting circuit section SLDC (composed of series-connected transistors 154 to 158). In more detail, the source high potential detecting circuit section SHDC is composed of a voltage division circuit of the transistors 149 to 152 and the transistor 153 to the gate of which the internal signal T is inputted. The potential at the junction point between the two transistors 151 and 152 is given to a switching gate 148 via two inverters 159 and 160. On the other hand, the source low potential detecting circuit section SLDC is of differential mechanism. In this differential mechanism, the source potential detection line voltage VS1 inputted to the gate of the transistor 155 is compared with a low voltage of 1.5 V inputted to the gate of the transistor 156, and the comparison result is outputted through an inverter 161 connected to the source of the transistor 155. The output of the inverter 161 is connected to a switching gate 147. Two switching gates 147 and 148 are controlled on the basis of the test control signal T1, and the detection result is outputted as the source potential detection output DVS1.

Figure 17:
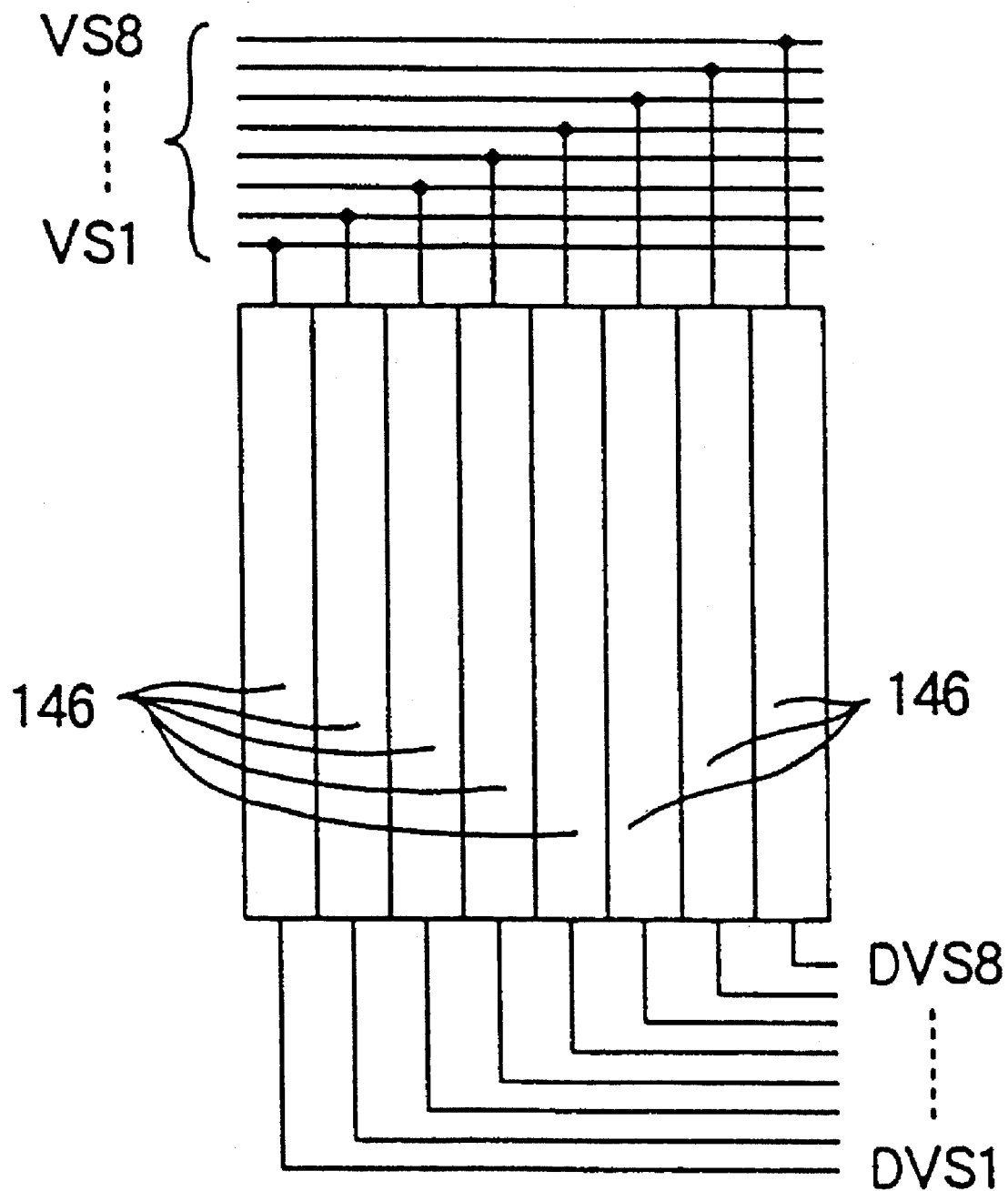
FIG. 17 is an illustration for assistance in explaining the connection of the source potential detecting circuit shown in FIG. 16.

As shown by the connection diagram in FIG. 17, the source potential detection circuit 146 is connected to each of the source potential detection lines VS1 to VS8, and the detection result of each source potential can be outputted as the source potential detection output DVS1 to DVS8, respectively.

Further, in the source potential detection circuit 146, when the potential of the source potential detection lines VS1 to VS8 is higher than 10 V, the source high potential detection circuit SHDC outputs the "H" level at a node J, and when the potential of the source potential detection lines VS1 to VS8 is higher than the reference potential of 1.5 V, the source low potential detection circuit SLDC outputs the "H" level at a node K.

Figure 18:
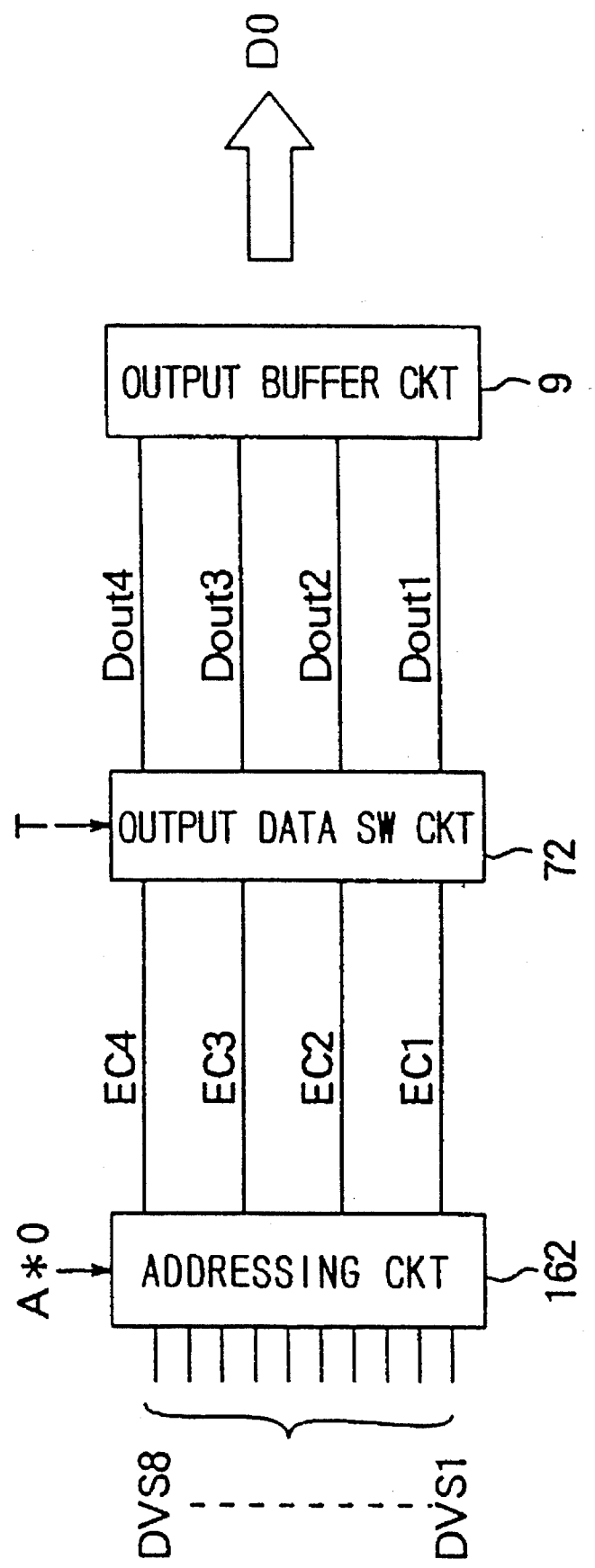
FIG. 18 is a block diagram for assistance in explaining the output processing of the source potential detecting circuit shown in FIG. 16.

The output of the source potential detecting circuit 146, that is, the source potential detection outputs DVS1 to DVS8 are processed by a circuit as shown in FIG. 18. In more detail, the source potential detection outputs DVS1 to DVS8 are inputted to the addressing circuit 162 which is quite the same as that shown in FIG. 4. In this easel however, the source potential detection outputs DVS1 to DVS8 are inputted, instead of the select latch signals EB1 to EB8. The addressing circuit 162 outputs the addressing signals EC1 to EC4 on the basis of the selection of the source potential detection outputs DVS1 to DVS8. The addressing signals EC1 to EC4 are given to the output data switch circuit 72 whose construction is quite that shown in FIG.

5. The output data switch circuit 72 selects both the addressing signals EC1 to EC4 and the internal data D*1 to D*4 (see FIG. 1) on the basis of the internal signal T, and outputs them to the input/output circuit 9 as the output data Dout1 to Dour4. The data Dout1 to Dour4 are outputted through an output buffer circuit 9 to the outside as the data D0.

Figure 19:
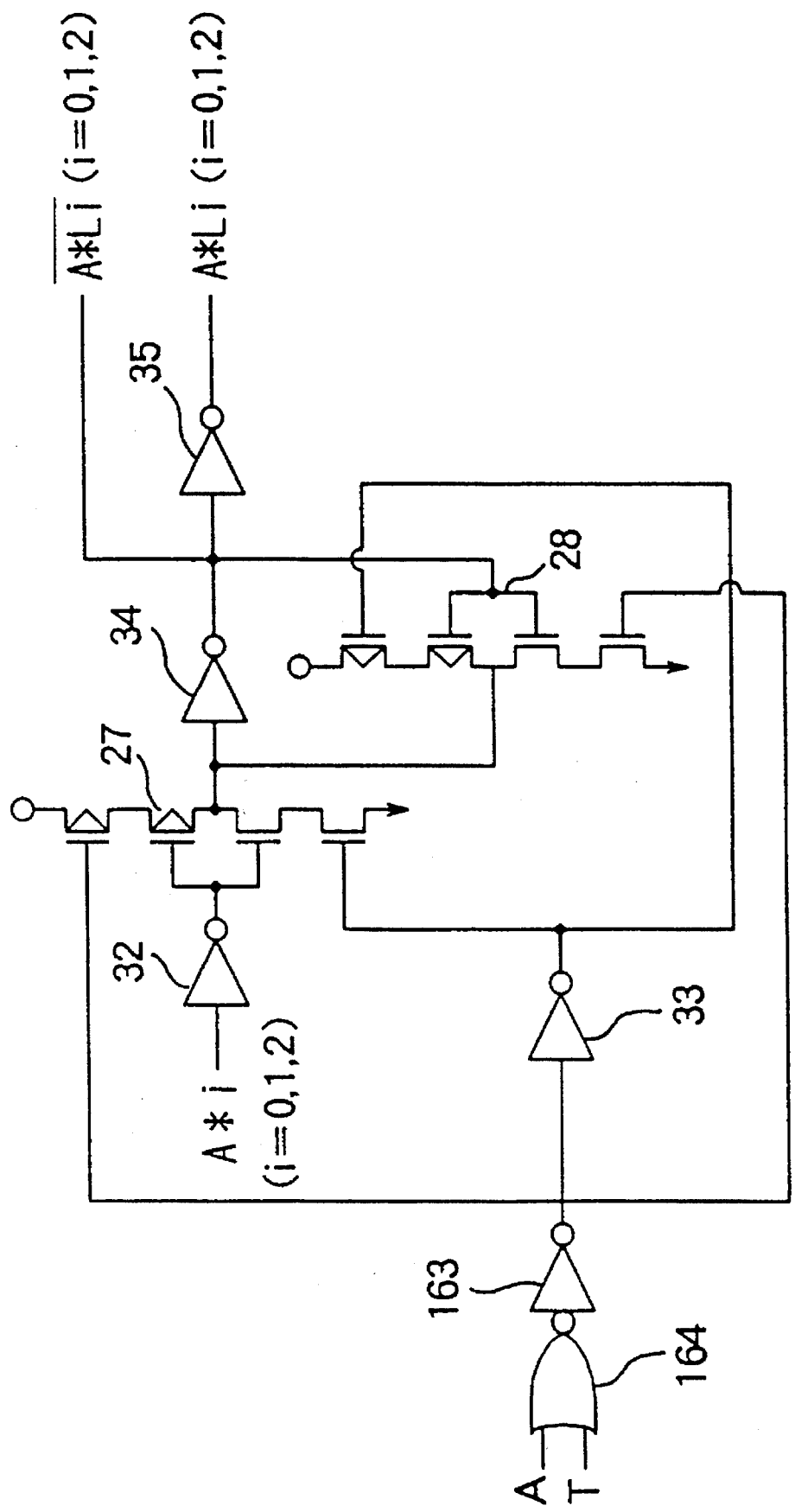
FIG. 19 is a circuit diagram showing an address latch circuit used for the third embodiment.
Figure 23:
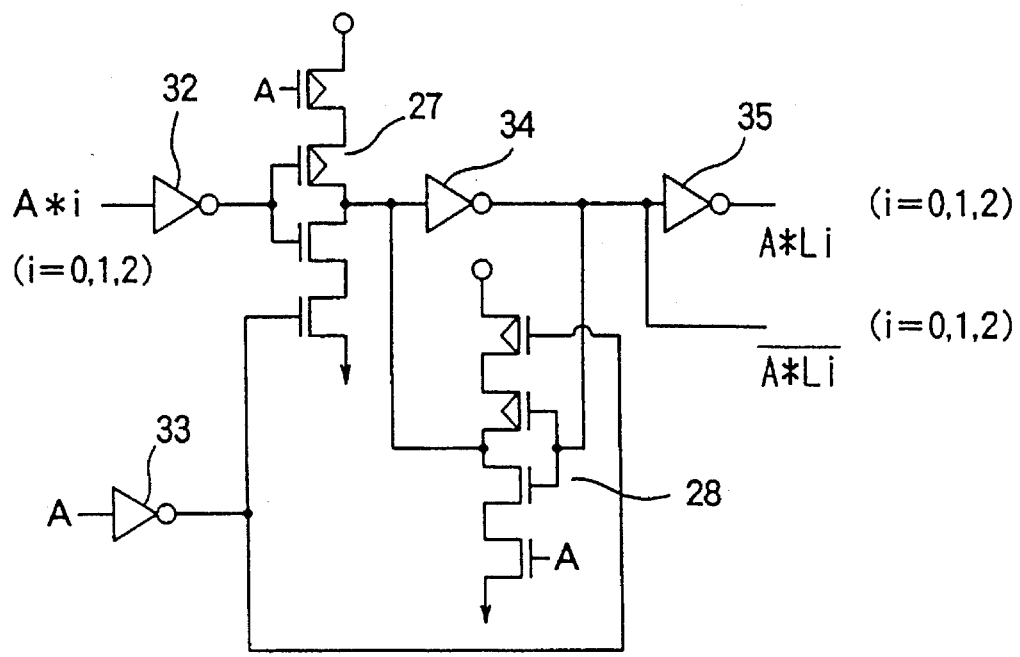
FIG. 23 is a circuit diagram showing an address latch circuit shown in FIG. 20.
Figure 24:
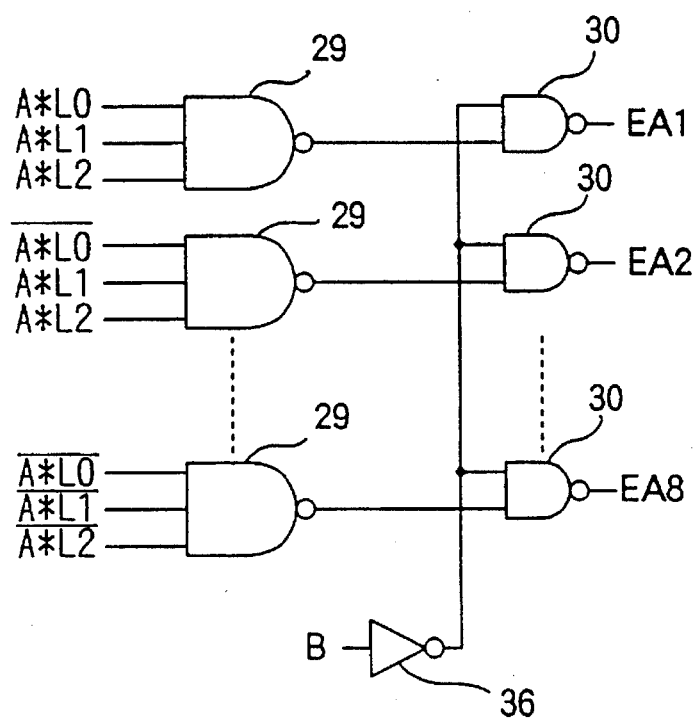
FIG. 24 is a circuit diagram showing a block decoder shown in FIG. 20.

Further, in this third embodiment a circuit as shown in FIG. 19 is used as the address latch circuit 4. The circuit construction different from that shown in FIG. 23 is that the control signal to be given to the switched inverters 27 and 28 is the output signal of an inverter 163, instead of the internal signal A. The internal signal A and the internal signal T are both inputted to a NAND gate 164, and the output of NAND gate 164 is inputted to the inverter 163.

In other words, in this circuit construction, the address latch circuit 4 can latch the block address even if the internal signal T is given, instead of the internal signal A.

Further, in this third embodiment, although the constant voltage generating circuit 102 is used, the circuit construction thereof is quite the same as that shown in FIG. 11, except that the test control signal T1 is fixed to the "L" level and the test control signal/T1 is fixed to the "H" level so that the output voltage of the non-selected cell source voltage supply clocks CSC1 to CSC8 is set to 2 V.

The device construction other than the above is the same as the second embodiment shown in FIG. 7.

The operation of the third embodiment will be described hereinbelow.

Now, when the test command is inputted, in the same way as with the case of the erasure operation, the voltage signal SW is set to 12 V. As a result, the output voltage of the cell source voltage supply blocks CSC1 to CSC8 as shown in FIG. 8 is set to 12 V for the selected cell block.

Here, when a high voltage of 12 V is applied to the address pad 136, that is, when a predetermined address pin of the test control signal generating circuit 100 shown in FIG. 12, since the test control signal T1 changes to the "H" level and the test control signal/T1 changes to the "L" level, the output signal at the node J of the source potential detection circuit 146 is outputted as the source potential detection output DVS1 to DVS8. For instance, in the test mode and when the block addresses A*0 to A*2 for selecting the cell block 1 are latched by the address latch circuit 4, the voltage of the source potential detection line VS1 is 12 V and the voltage of the source potential detection output DVS2 to DVS8 is 2 V.

Therefore, when the "L" level signal is inputted to the address A0, data "1" is outputted as the data corresponding to the cell block 1 of the input/output circuit 9, and data "0" are outputted as the other remaining data outputs. After that, when the "H" level signal is inputted to the address A0, all the data "0" are outputted from the input/output circuit 9.

On the other hand, in the test control signal generating circuit 100, when the voltage of the address pad 136 is lowered from 12 V to 5 V, the output signal at the node K of the source potential detection circuit 146 is outputted as the source potential detection output DVS1 to DVS8. Therefore, even if the "L" or "H" level signal is inputted to the address A0, the data "1" is outputted from the input/output circuit 9. Therefore, in case there exists a defectiveness in the cell source voltage supply blocks CSC1 to CSC8 and thereby the source line voltage of the selected cell block is lower than 10 V, it is possible to detect this defectiveness in the test mode.

In the same way as above, in case the voltage of 2 V supplied to the cell source lines of the non-selected cell blocks drops, it is possible to detect this defectiveness in the test mode.

As described above, in this third embodiment, it is possible to check whether the decoding operation of the cell block is normal or not and simultaneously whether a predetermined voltage is applied to the cell source lines of the cell blocks normally.

As described above, in the first to third embodiments of the present invention, the test time required for the block erasure can be shortened by simply adding simple circuits to the inside of a chip. In addition, it is possible to check the erasure operation and the write operation for each circuit block related to each operation, so that the test time and test labor required for the chip can be eliminated markedly, thus reducing the cost of the semiconductor memory device.

According to the present invention, since the output signal of the decoding means is outputted to the outside, it is possible to check whether the decoder circuit operates normally or not in a short test time, without effecting the actual block erasure operation. In addition, since the bit line potentials can be detected in unit of the selected block cell array unit, it is possible to check whether the source voltage supplying means is operating normally in a short test time. In addition, according to the present invention, since the all bit erasure test and the normal operation test of the decoding means for selecting each unit block cell array can be both made, it is possible to achieve the erasure test in a short time for each unit block cell array.

What is claimed is:

1. A method for testing a semiconductor memory device comprising a memory cell array having a plurality of cell blocks each having a plurality of memory cells and a block decoder responsive to a block address, for outputting a decoder signal, comprising:

a all bits erase test step for testing all of the memory cells; and a block decoder test step for testing the block decoder to detect whether said block decoder outputs a correct decoded signal responsive to a updated block address.

2. A non-volatile semiconductor memory device, comprising:

a memory cell array having a plurality of cell blocks, each of the cell blocks being composed of a plurality of memory cells arranged into a matrix pattern, drains of said memory cells arranged in a column direction being connected to a corresponding bit line, sources of the memory cells being connected in common as a common source line, each of the memory cells having a floating gate to or from which electrons are injected or extracted to write or erase data, said memory cell being erased by applying a erase voltage from a source voltage supplying circuit to the common source line, said memory cell array further comprising read out means for detecting potentials of said bit lines;

a block decoder responsive to a block address, for outputting a decode signal to select a cell block corresponding to the block address from the cell blocks, the memory cells of the selected block being erased simultaneously;

a source voltage supplying circuit for supplying a source voltage to each common source line of each of the cell blocks in such a way that the source voltage supplied to the cell block selected by said block decoder and the source voltage supplied to the cell blocks not selected thereby are different from each other; and testing means for, by applying test voltages to said common source lines at test mode, detecting potentials of the bit lines to detect whether said bit lines being correctly selected by said block decoder.

3. The non-volatile semiconductor memory device of claim 2, which further comprises address updating means for updating the block address given to said block decoder, the cell block selected by said block decoder being updated in sequence, potential on each bit line being readable in each updated status.

4. The non-volatile semiconductor memory device of claim 2, wherein said reading means includes differential amplifiers each for outputting a comparison result between the potential on each bit line and a reference potential, respectively as a detected potential.

5. The non-volatile semiconductor memory device of claim 3, wherein bit line potential setting means for setting the bit line potential to a predetermined value, respectively according to on-off status of each of the memory cells connected to the bit lines is connected between each of the bit lines and each of said differential amplifiers.

6. The non-volatile semiconductor memory device of claim 5, wherein said source voltage supplying circuit is connected to a voltage switch circuit for supplying a voltage different from a source voltage to said source voltage supplying circuit.

7. The non-volatile semiconductor memory device of claim 2, wherein said source voltage supplying circuit outputs a first erase level voltage to the selected cell block and a second erase level voltage to the non-selected cell blocks in erasure operation, a first program level voltage to the selected cell block and a second program level voltage to the non-selected cell blocks in program operation, and a read level voltage in read operation, respectively.

8. The non-volatile semiconductor memory device of claim 3, wherein said source voltage supplying circuit outputs a first erase level voltage to the selected cell block and a second erase level voltage to the non-selected cell blocks in erasure operation, a first program level voltage to the selected cell block and a second program level voltage to the non-selected cell blocks in program operation, a read level voltage in read operation, and a first test level voltage lower than said first erase level voltage to the selected cell block and a second test level voltage lower than the first test level voltage to the non-selected cell block in test operation, respectively.

9. The non-volatile semiconductor memory device of claim 8, wherein said source voltage supplying circuit is connected to a constant voltage generating circuit for outputting the second program level voltage and said second test level voltage.

10. The non-volatile semiconductor memory device of claim 9, wherein said constant voltage generating circuit is connected to a test control signal generating circuit for outputting a test control signaling response to a test voltage applied to an input terminal of said test control signal generating circuit, the test control signal being applied to said constant voltage generating circuit to output the second program level voltage and said second test level voltage.

* * * * *